United States Patent
Furuichi et al.

(10) Patent No.: US 8,598,859 B2
(45) Date of Patent: Dec. 3, 2013

(54) POWER SUPPLY CONTROLLER

(75) Inventors: Masahiko Furuichi, Yokkaichi (JP); Seiji Takahashi, Yokkaichi (JP)

(73) Assignees: Autonetworks Technologies, Limited, Mie (JP); Sumitomo Wiring Systems, Limited, Mie (JP); Sumitomo Electric Industries, Limited, Osaka (JP)

( * ) Notice: Subject to any disclaimer, the term of this patent is extended or adjusted under 35 U.S.C. 154(b) by 1317 days.

(21) Appl. No.: 12/227,604

(22) PCT Filed: May 22, 2007

(86) PCT No.: PCT/JP2007/060439
§ 371 (c)(1),
(2), (4) Date: Nov. 21, 2008

(87) PCT Pub. No.: WO2007/138929
PCT Pub. Date: Dec. 6, 2007

(65) Prior Publication Data
US 2009/0167272 A1    Jul. 2, 2009

(30) Foreign Application Priority Data
May 29, 2006    (JP) ................... 2006-148902

(51) Int. Cl.
*G05F 1/56*    (2006.01)
*G05F 1/565*    (2006.01)

(52) U.S. Cl.
USPC .......................................... 323/284; 323/274

(58) Field of Classification Search
USPC ............ 323/273, 276, 908, 284, 274; 361/18, 361/93.1, 93.2; 307/131; 363/50, 56.03
See application file for complete search history.

(56) References Cited

U.S. PATENT DOCUMENTS

| | | | |
|---|---|---|---|
| 4,012,701 A * | 3/1977 | Sugimoto et al. | 331/117 R |
| 4,937,697 A * | 6/1990 | Edwards et al. | 361/18 |
| 5,501,517 A | 3/1996 | Kiuchi | |
| 5,867,014 A * | 2/1999 | Wrathall et al. | 323/316 |
| 6,356,138 B1 * | 3/2002 | Ohshima | 327/434 |
| 6,366,068 B1 * | 4/2002 | Morishita | 323/282 |

(Continued)

FOREIGN PATENT DOCUMENTS

| | | |
|---|---|---|
| JP | A-61-177516 | 8/1986 |
| JP | A-06-188641 | 7/1994 |

(Continued)

OTHER PUBLICATIONS

Japanese Office Action issued in Japanese Patent Application No. 2007-545759 dated Feb. 15, 2011 (with translation).

(Continued)

*Primary Examiner* — Adolf Berhane
*Assistant Examiner* — Nusrat Quddus
(74) *Attorney, Agent, or Firm* — Oliff & Berridge, PLC

(57) ABSTRACT

A first current corresponding to the drain-to-source voltage of a power MOSFET can pass through an FET; and a second current corresponding to a constant voltage can pass through an FET; a third current corresponding to the difference determined by subtracting the first current from the second current can pass into threshold setting resistors from the connecting point between FETs. Consequently, divided voltages at the connecting points between the threshold setting resistors varies directly with a voltage corresponding to the difference determined by subtracting the drain-to-source voltage of the power MOSFET from the constant voltage.

6 Claims, 19 Drawing Sheets

(56) References Cited

U.S. PATENT DOCUMENTS

| | | |
|---|---|---|
| 6,373,671 B1 | 4/2002 | Watanabe et al. |
| 2003/0072120 A1 | 4/2003 | Ishikawa et al. |
| 2004/0032701 A1 | 2/2004 | Yoshida |
| 2006/0050449 A1* | 3/2006 | Wu .................................. 361/18 |

FOREIGN PATENT DOCUMENTS

| | | |
|---|---|---|
| JP | A-11-326400 | 11/1999 |
| JP | A-2000-125463 | 4/2000 |
| JP | A-2000-299631 | 10/2000 |
| JP | A-2001-217696 | 8/2001 |
| JP | A-2002-314389 | 10/2002 |
| JP | A-2003-111264 | 4/2003 |
| JP | A-2004-80346 | 3/2004 |
| JP | A-2005-163967 | 6/2005 |

OTHER PUBLICATIONS

Japanese Office Action in Japanese Patent Application No. 2007-545759 on May 25, 2010. (with English-language translation).

* cited by examiner

FIG.7

| COUNT VALUE | bit0 | bit1 | bit2 | bit3 | bit4 | bit5 |
|---|---|---|---|---|---|---|
| 0≤m<8 | Lo | Hi | Hi | Hi | Hi | Hi |
| 8≤m<16 | Hi | Lo | Hi | Hi | Hi | Hi |
| 16≤m<32 | Hi | Hi | Lo | Hi | Hi | Hi |
| 32≤m<64 | Hi | Hi | Hi | Lo | Hi | Hi |
| 64≤m<128 | Hi | Hi | Hi | Hi | Lo | Hi |
| 128 ≤ m | Hi | Hi | Hi | Hi | Hi | Lo |

POWER SUPPLY CONTROLLER

TECHNICAL FIELD

The present invention relates to a power supply controller, and particularly relates to detection of a current anomaly due to short-circuiting in a load or the like.

BACKGROUND ART

A power supply controller is conventionally provided, in which a high-power semiconductor switching element such as a power MOSFET is disposed on a current supply line connected between a power source and a load, and which is configured to control the power supply to the load by switching the semiconductor switching element between ON and OFF. It is known that some of such power supply controllers have a self-protective function. When an overcurrent (i.e., an abnormal current) has occurred on the current supply line due to short-circuiting in the load, for example, the self-protective function turns off the semiconductor switching element by controlling the potential of the control terminal (e.g., the gate in the case of a MOSFET) of the semiconductor switching element, in order to protect the semiconductor switching element. Specifically, as shown in JP-A-2001-217696, a current detecting resistor (shunt resistor) is serially connected to the load terminal (e.g., the source or drain in the case of a MOSFET) of the semiconductor switching element, and the value of a load current passing through the semiconductor switching element is detected based on the interterminal voltage of the resistor. If the load current value is larger than a predetermined threshold, an occurrence of an overcurrent anomaly is determined, so as to turn off the semiconductor switching element resulting in a shutoff state.

A current passing through the semiconductor switching element will vary along a predetermined load line, until a stable state is reached after start-up of the semiconductor switching element. Therefore, in the case that an overcurrent anomaly is detected based on comparison of the load current value of the semiconductor switching element with the threshold, there arises a problem that it may require time before detection when an overcurrent anomaly has occurred, if the threshold is set to a fixed level. For example, FIG. 17 shows the drain-to-source voltage Vds of a power MOSFET as the above semiconductor switching element and the current Id passing therethrough. If the load is in a normal state, after the power MOSFET turns ON, the values of the drain-to-source voltage Vds and the current Id will vary along the load line L0 starting from the point B0 resulting in settlement at the stabilization point A0.

However, in case that an anomaly such as short-circuiting in the load has occurred, although the values of the drain-to-source voltage Vds and the current Id can start from the point B0 on start-up, the source voltage of the power MOSFET will thereafter rise very little because the voltage drop in the load is extremely low. That is, the current Id passing through the power MOSFET will rise steeply while the drain-to-source voltage Vds of the power MOSFET varies little. If the threshold is set to a fixed level, i.e., if one threshold value is used for detection of any overcurrent anomaly capable of occurrence at some point between start-up of the power MOSFET and a stable state being reached, the threshold should be set to a fixed level higher than the current value Id of the stabilization point A0 (as shown by Line L7 in the figure) so that an overcurrent anomaly can be detected even after the stabilization point A0 is reached. In this case, if short-circuiting occurs immediately after the power MOSFET turns ON, it requires considerable time before the threshold is reached as shown by Line L6. This will result in great power loss in the power MOSFET, and cause delay in protection.

In view of the above, the present applicant developed an invention and already applied for patent (Japanese Patent Application No. 2005-163967), according to which a voltage corresponding to the output-side voltage (e.g., the source voltage or drain voltage in the case of a MOSFET) of a semiconductor switching element is generated so that an overcurrent anomaly can be detected based on whether a load current passing through the semiconductor switching element exceeds a threshold value corresponding to the generated voltage. According to this construction, the threshold can be set so as to increase or decrease with the output-side voltage of the semiconductor switching element. Thereby, in case that short-circuiting has occurred in the load, for example, the load current will immediately reach the threshold, so that rapid protection can be achieved compared to a construction in which a threshold is set to a fixed level.

However, in the above construction, the threshold will be accordingly set to a low value when the semiconductor switching element is in a stable state after start-up but the power supply voltage is low, because the threshold is changed according to the output-side voltage of the semiconductor switching element. In this case, an overcurrent anomaly may be determined resulting in turn-off of the semiconductor switching element, even when the power loss in the semiconductor switching element is much lower than the allowable level for the semiconductor switching element. Thus, there has been a problem that the power supply operation of the semiconductor switching element may fail to be sufficiently achieved in some circumstances.

SUMMARY OF THE PRESENT INVENTION

A first aspect of the present invention provides a power supply controller for controlling power supply to a load by ON-OFF switching of a semiconductor switching element disposed on a current supply line connected between a power source and the load, which is configured to output an anomaly signal if a load current passing through the semiconductor switching element exceeds a threshold. In the power supply controller, the threshold decreases with increase of the input-to-output voltage of the semiconductor switching element, and increases with decrease of the input-to-output voltage.

According to the present invention, the threshold for an overcurrent anomaly is changed so as to decrease with increase of the input-to-output voltage of the semiconductor switching element, and increase with decrease of the input-to-output voltage. Therefore, if the semiconductor switching element is turned ON during short-circuiting in the load, for example, the load current can immediately reach the threshold at the time. Thus, rapid detection of an overcurrent anomaly can be achieved, compared to a construction in which a fixed threshold is provided. Further, the threshold depends on the input-to-output voltage of the semiconductor switching element, instead of the output-side voltage thereof. Thereby, performance degradation in power supply operation of the semiconductor switching element due to variation in the power supply voltage can be suppressed.

BRIEF DESCRIPTION OF THE DRAWINGS

[FIG. 7] is a table showing a correspondence relation between a count value and a bit signal of a fuse time counter;

DETAILED DESCRIPTION OF THE PRESENT INVENTION

<Embodiment>

An embodiment according to the present invention will be explained with reference to FIGS. 1 through 15.

1. Construction of Power Supply Controller

Figure 1:
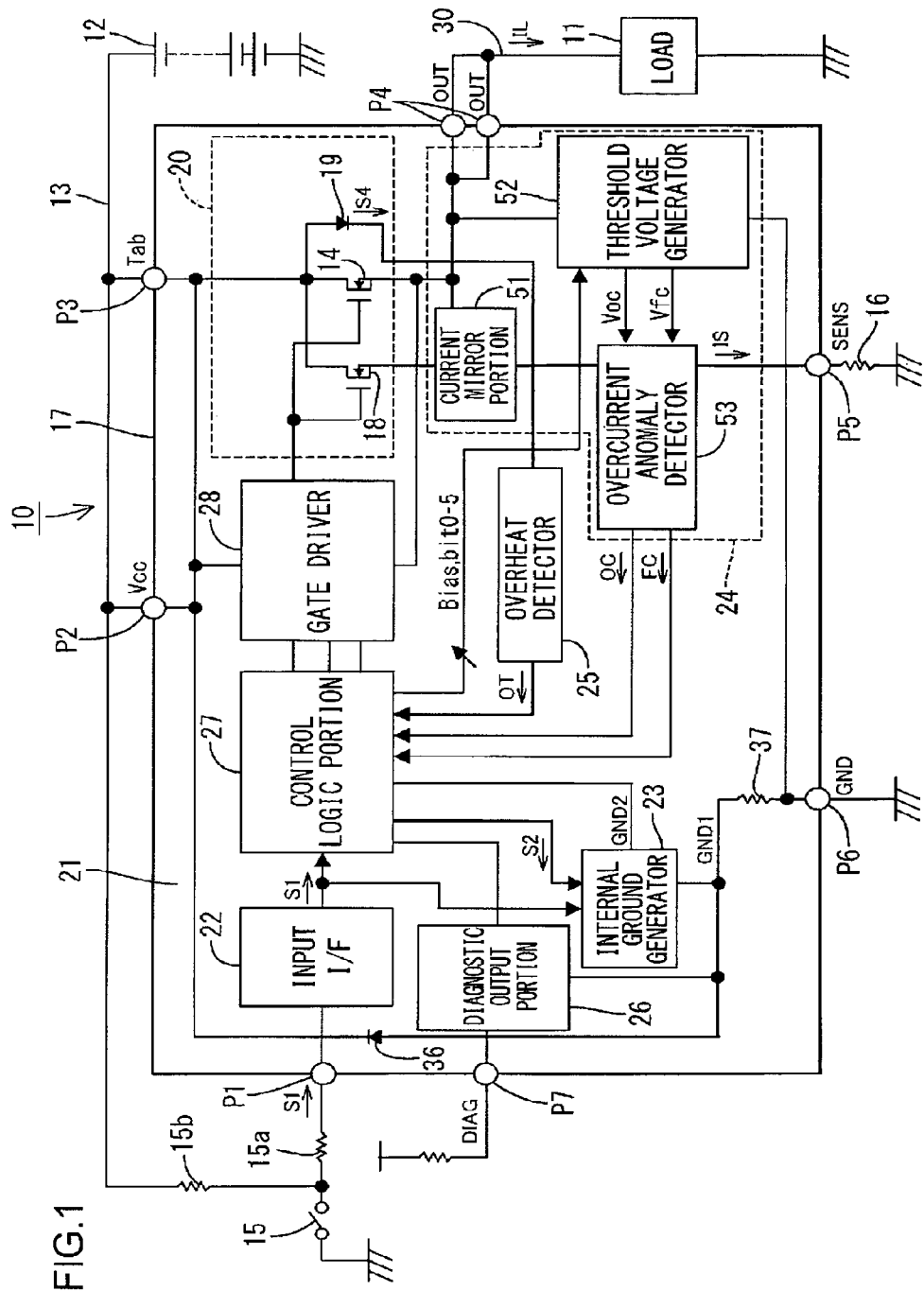
[FIG. 1] is a block diagram showing the general construction of a power supply controller according to an embodiment of the present invention.

FIG. 1 is a block diagram showing the general construction of a power supply controller 10 according to the present embodiment. The power supply controller 10 can be installed on a vehicle not shown, and used for control of the power supply from a vehicle power source (hereinafter, referred to as "a power source 12") to a load 11. The load 11 may be a defogger heater (as a linear resistive load), a vehicle lamp, or a motor (as an L-load (or inductive load)) for a cooling fan or a wiper, for example. Hereinafter, "a load" means a device to be controlled by the power supply controller 10, and does not include an electric wire 30 connected between the power supply controller 10 and the controlled device. The load 11 and the electric wire 30 are collectively called "an external circuit".

Specifically, the power supply controller 10 includes a power MOSFET 14 (i.e., an example of "a semiconductor switching element") as a power FET disposed on a current supply line 13 connected between the power source 12 and the load 11. In the power supply controller 10, a control signal S1 such as a constant voltage signal or a PWM (Pulse Width Modulation) control signal is applied to the gate of the power MOSFET 14 so as to switch the power MOSFET between ON and OFF. Thereby, power supply to the load 11 connected to the output side of the power MOSFET 14 is controlled. In the present embodiment, an input terminal P1 of the power supply controller 10 is connected to an external operation switch 15, and the power supply controller operates when the operation switch 15 is ON. Specifically the input terminal P1 is connected to the operation switch 15 via a resistor 15a, and the connecting point between the operation switch 15 and the resistor 15a is connected to the power source 12 via a resistor 15b. Thus the input terminal P1 is pulled up to the power supply voltage Vcc side when the operation switch 15 is OFF.

As shown in FIG. 1, the power supply controller 10 is formed as a semiconductor device 17 (semiconducting device), on which the input terminal P1, a power supply (Vcc) terminal P2 and a tab terminal P3 to be connected to the power source 12, a load connecting terminal P4 to be connected to the load 11, an external terminal P5 to be connected to the ground (GND) via an external resistor 16 as a current-voltage converter circuit, a ground terminal P6 to be connected directly to the ground (GND), and a diagnostic output terminal P7 are provided. In the present embodiment, the power MOSFET 14, a sense MOSFET 18 (i.e., an example of "a current detecting element") as a sense FET described below and a temperature sensor 19 (e.g., a diode in the present embodiment) as a temperature detecting element are configured onto a single chip as a power chip 20, which is mounted on a control chip 21.

Figure 3:
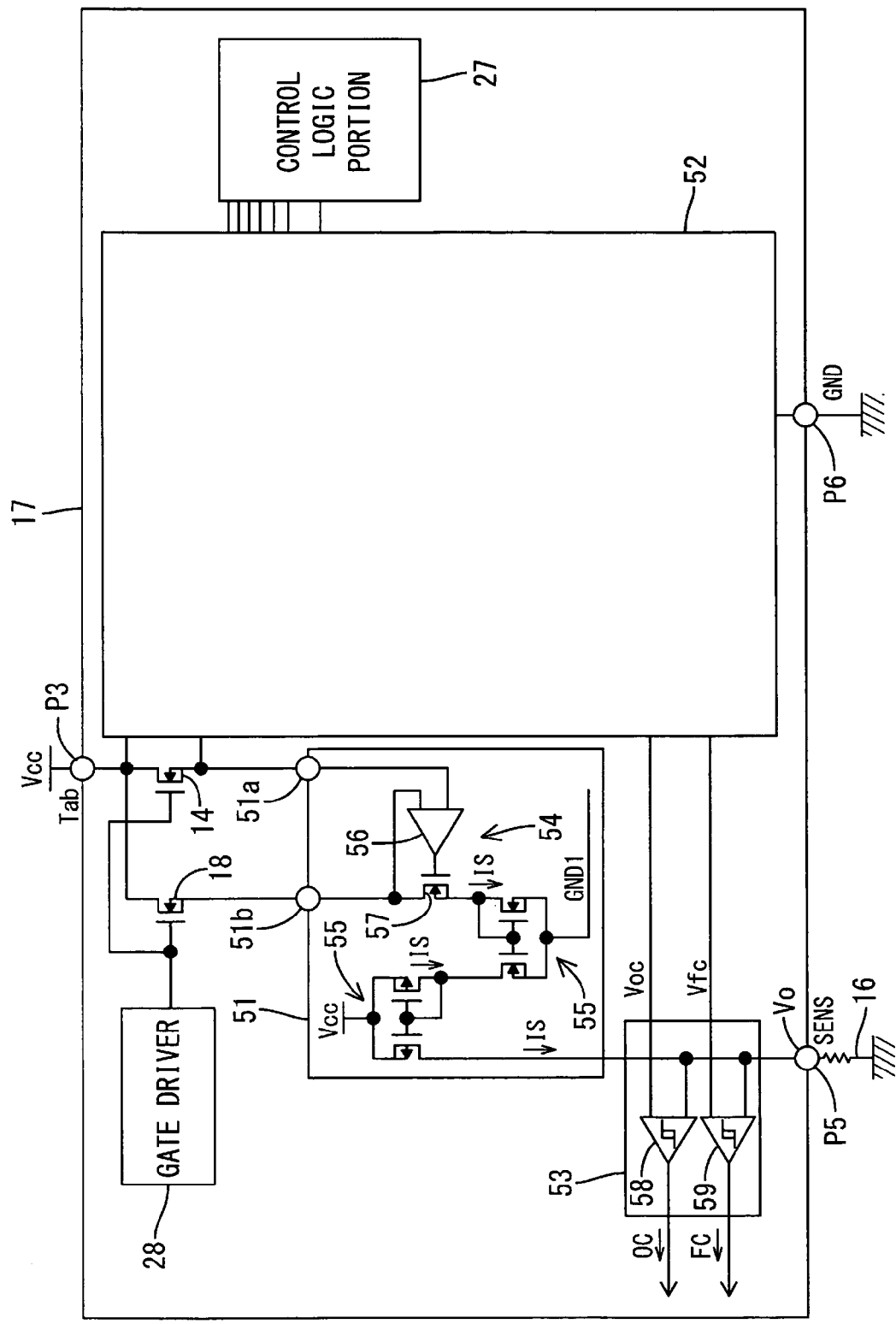
[FIG. 3] is a circuit diagram of a current mirror portion, a threshold voltage generator and an overcurrent anomaly detector.

A plurality of n-channel MOSFETs are arranged on the power chip 20. The drains of the MOSFETs are connected in common to one another, and further connected to the tab terminal P3. The sources of most of the MOSFETs are connected in common to a power FET input 51a of a current mirror portion 51 described below and the load connecting terminal P4, so that the MOSFETs form the power MOSFET 14 as shown in FIG. 3. The sources of the rest of the MOSFETs are connected in common to a sense FET input 51b of the current mirror portion 51, so that the MOSFETs form the sense MOSFET 18. The ratio of the number of MOSFETs constituting the sense MOSFET 18 to the number of MOSFETs constituting the power MOSFET 14 corresponds approximately to a sense ratio k.

The control chip 21 mainly includes an input interface 22, an internal ground generator 23, a current detector 24, an overheat detector 25, a diagnostic output portion 26, a control logic portion 27 and a gate driver 28. A diode 36, the cathode side of which is connected to the higher potential side, and a resistor 37 are serially connected between the power supply terminal P2 and the ground terminal P6 as shown in FIG. 1. The connecting point therebetween is provided as an internal ground GND1. According to this construction, if the ground terminal P6 side is connected to the power supply voltage Vcc side by mistake, a current passing into the circuits of the power supply controller 10 is suppressed because of the diode 36 so as to be equal to or lower than a predetermined level.

(Input Interface)

The input side of the input interface 22 is connected to the input terminal P1. Thereby a high level control signal S1 is inputted when the operation switch 15 is OFF, while a low level control signal S1 is inputted when the operation switch is ON. The control signal S1 is then applied to the internal ground generator 23 and the control logic portion 27. In a normal state, i.e., when neither a current anomaly nor a temperature anomaly has occurred as will be described below, the power supply controller 10 turns ON the power MOSFET 14, resulting in a conductive state, by the gate driver 28 in response to a low-level control signal S1 described above. On the other hand, in response to a high-level control signal S1, the power supply controller turns OFF the power MOSFET 14 by the gate driver 28, resulting in a shutoff state. In the present embodiment, a low-level control signal S1 corresponds to an ON signal (a load ON signal), while a high-level control signal S1 corresponds to an OFF signal. The gate driver 28 functions as a switch control circuit.

(Internal Ground Generator)

The internal ground generator 23 as an internal power circuit operates when it receives a low-level control signal S1 (ON signal) from the input interface 22 or a low-level output signal S2 (indicating that a clear counter 72 has not overflowed) from the clear counter 72 described below, so as to generate an internal ground GND2 lower than the power supply voltage Vcc by a predetermined constant voltage Vb. That is, the internal ground generator 23 is maintained to the operational state so as to continue generation of the internal ground GND2 as long as a low-level output signal S2 is received from the clear counter 72, even if a high-level control signal S1 (OFF signal) is received from the input interface 22 after turn-on. Thus the constant voltage Vb, corresponding to the difference determined by subtracting the internal ground GND2 from the power supply voltage Vcc, is provided for the control logic portion 27, and thereby the control logic portion 27 can operate.

Figure 2:
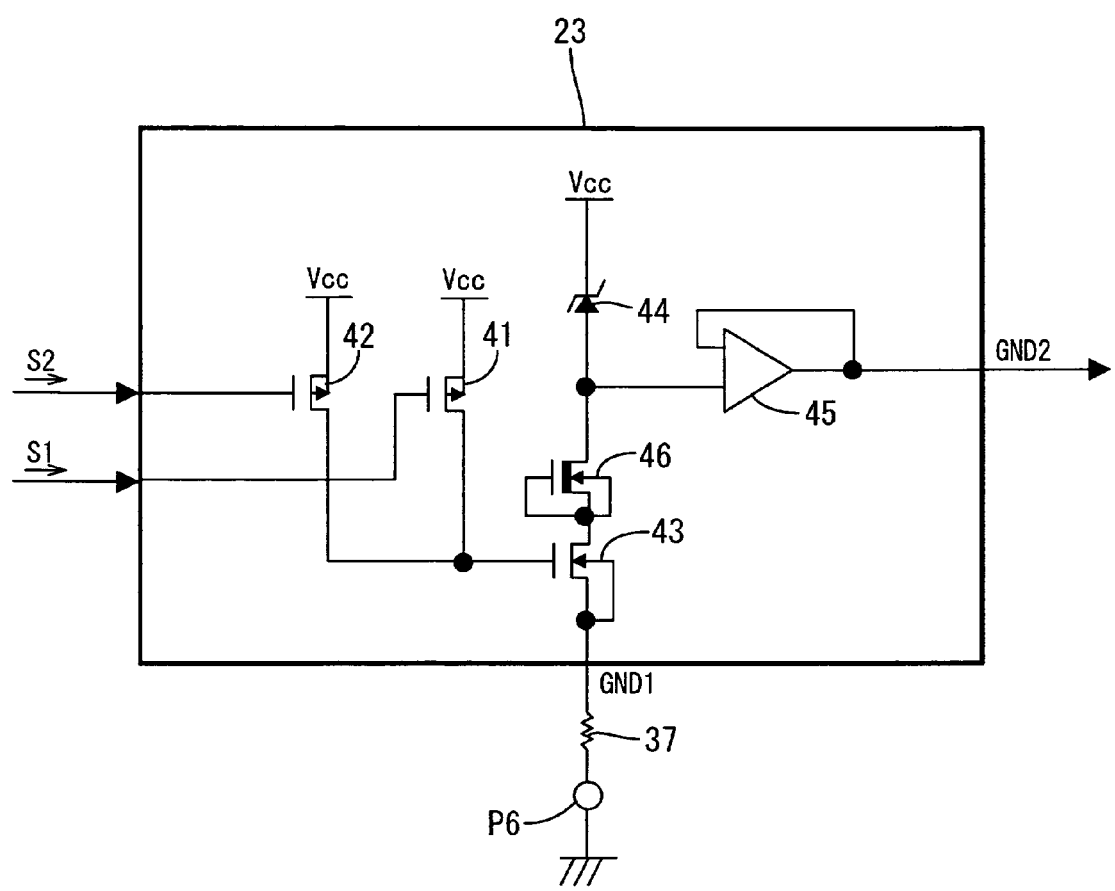
[FIG. 2] is a circuit diagram of an internal ground generator.

Specifically, as shown in FIG. 2, the internal ground generator 23 includes an FET 41 as a switching element to be turned on in response to a low-level control signal S1 (ON signal), and an FET 42 as a switching element to be turned on in response to a low-level output signal S2. The output sides of the FETs 41, 42 are both connected to the control terminal of an FET 43 as a switching element. The input side (i.e., the drain side) of the FET 43 is connected to the power supply terminal P2 via a Zener Diode 44, while the output side (i.e., the source side) thereof is connected to the ground terminal P6 via the above resistor 37.

In the internal ground generator 23, the FET 43 is turned on in response to a low-level control signal S1 or a low-level output signal S2 described above. Thereby the internal ground generator operates so as to generate the internal ground GND2, which is lower than the power supply voltage Vcc by a voltage corresponding to the Zener voltage of the Zener diode 44. The generated internal ground is provided for the control logic portion 27, via an operational amplifier 45 as a voltage follower. In the present embodiment, an FET 46, in which short connection between the source and gate (i.e., diode connection) is formed, is disposed on a current supply line connected between the Zener diode 44 and the FET 43. Thereby a constant current passes through the Zener diode 44 when the FET 43 is on, and consequently a more stable internal ground GND2 can be generated.

(Current Detector)

The current detector 24 includes a current mirror portion 51, a threshold voltage generator 52, and an overcurrent anomaly detector 53 as shown in FIG. 1. FIG. 3 is a circuit diagram mainly showing the current mirror portion 51, the threshold voltage generator 52 and the overcurrent anomaly detector 53, and the rest of the circuit construction is partly omitted.

a. Current Mirror Portion

The current mirror portion 51 includes a potential controller 54 for maintaining the output-side potentials (i.e., the source potentials) of the power MOSFET 14 and the sense MOSFET 18 to be equal to each other, and further includes a pair of current mirror circuits 55 and 55.

The potential controller 54 includes an operational amplifier 56 and an FET 57 as a switching element. The pair of input terminals of the operational amplifier are connected to the power FET input 51a (i.e., to the source of the power MOSFET 14) and the sense FET input 51b (i.e., to the source of the sense MOSFET 18), respectively. The FET 57 is connected between the sense FET input 51b and the external terminal P5, and the output of the operational amplifier 56 is applied to the control terminal thereof. More specifically, the negative input of the operational amplifier 56 is connected to the power FET input 51a, while the positive input of the operational amplifier 56 is connected to the sense FET input 51b. The differential output of the operational amplifier 56 is fed back to the positive input through between the gate and drain of the FET 57.

The operational amplifier 56 is maintained in an imaginary short state due to the feedback of the differential output of the operational amplifier 56, that is, the potentials of the positive input and negative input are maintained almost equal to each other. Thereby the potentials of the drains of the power MOSFET 14 and the sense MOSFET 18 are maintained equal to each other, and the potentials of the sources thereof are also maintained equal to each other. Consequently, a sense current Is (i.e., an example of "a detection signal from a current detecting element") passing through the sense MOSFET 18 can be stably maintained to a constant ratio (i.e., the above sense ratio k) to a load current IL passing through the power MOSFET 14.

The sense current Is from the potential controller 54 passes into the external resistor 16 via the pair of current mirror circuits 55, 55 and the external terminal P5, and therefore the terminal voltage Vo of the external terminal P5 varies with the sense current Is.

b. Overcurrent Anomaly Detector

The overcurrent anomaly detector 53 includes one comparator or a plurality (e.g., two in the present embodiment) of comparators 58, 59 (e.g., hysteresis comparators in the present. embodiment). The terminal voltage Vo of the external terminal P5 is applied to one input of the comparator 58 and one input of the comparator 59.

The comparator 58 receives a first anomaly threshold voltage Voc on the other input thereof from the threshold voltage generator 52, and outputs a low-level output signal OC (i.e., an example of "an anomaly signal") to the control logic portion 27 when the terminal voltage Vo exceeds the first anomaly threshold voltage Voc. Hereinafter, a load current IL, passing through the power MOSFET 14 when the terminal voltage Vo reaches the first anomaly threshold voltage Voc, i.e., during a current anomaly, is called "a first anomaly threshold current ILoc" (i.e., an example of "a threshold"), and this current anomaly is called "an overcurrent".

The comparator 59 receives a second anomaly threshold voltage Vfc (<Voc) on the other input thereof from the threshold voltage generator 52, and outputs a low-level output signal FC (i.e., an example of "an anomaly signal") to the control logic portion 27 when the terminal voltage Vo exceeds the second anomaly threshold voltage Vfc. Hereinafter, a load current IL, passing through the power MOSFET 14 when the terminal voltage Vo reaches the second anomaly threshold voltage Vfc, i.e., during a current anomaly, is called "a second anomaly threshold current ILfc" (i.e., an example of "a threshold"), and this current anomaly is called "a fuse current".

c. Threshold Voltage Generator

Figure 4:
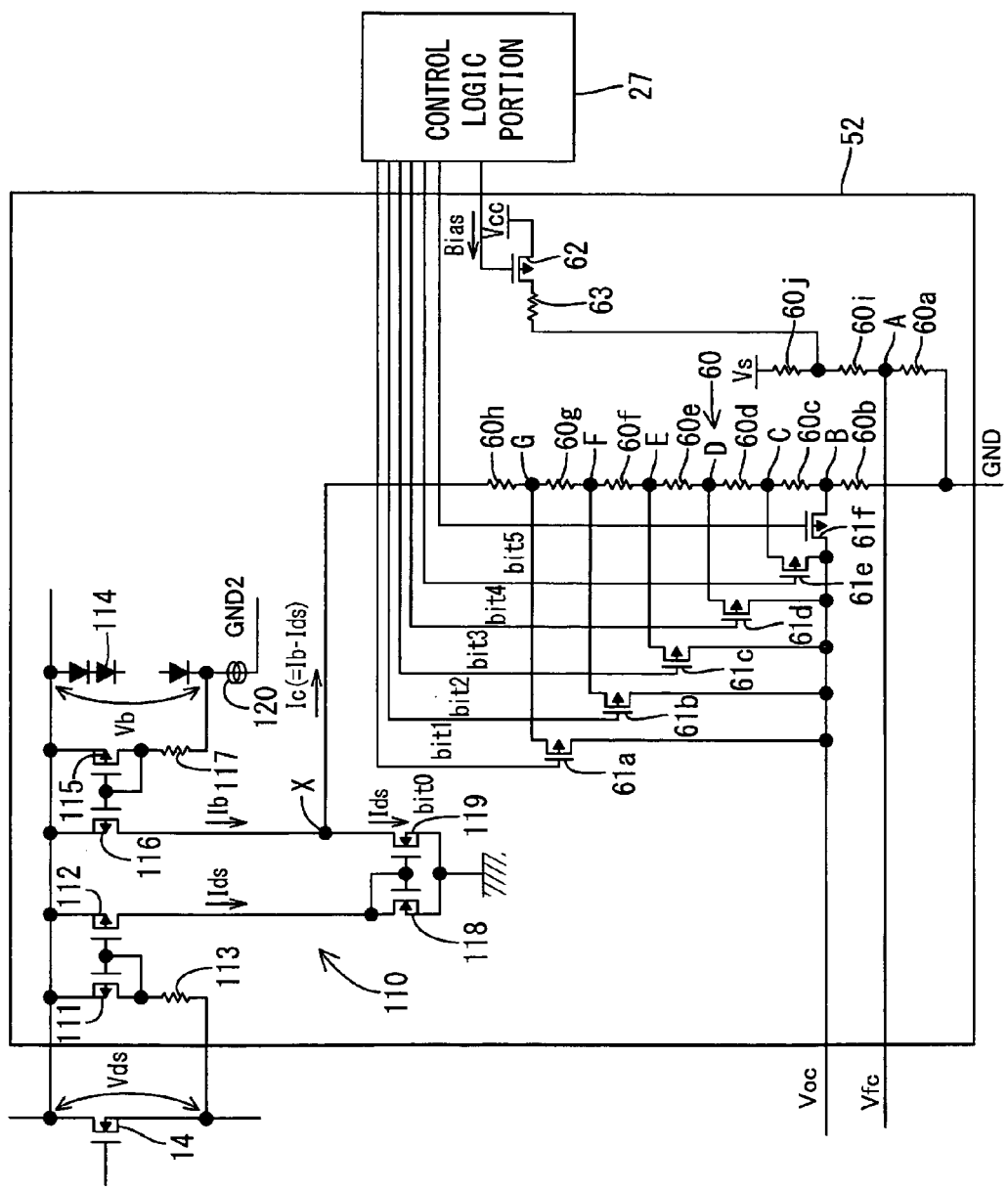
[FIG. 4] is a circuit diagram showing the elements of the threshold voltage generator.

As shown in FIG. 4, the threshold voltage generator 52 (i.e., an example of "a threshold adjustment circuit") includes a current output circuit 110, which outputs a current indicating the difference determined by subtracting a current corresponding to the drain-to-source voltage Vds of the power MOSFET 14 (i.e., an example of "an input-to-output voltage of a semiconductor switching element") from a current corresponding to a predetermined constant voltage, and further includes a threshold setting resistor 60, through which the output current from the current output circuit 110 passes.

The current output circuit 110 includes a pair of FETs 111, 112 which mutually form a current mirror circuit, and further includes a first resistor 113 that is disposed between the drain and source of the power MOSFET 14 and serially connected to the downstream side of the FET 111 (i.e., an FET on which diode connection is formed). Thereby, a first current Ids(=(Vds−Vt)/Rds, where Vt is a drain-to-source voltage of the FET 111 and Rds is a resistance value of the first resistor 113) can pass through the FET 112. The FETs 111, 112 and the first resistor 113 function as "a first current output circuit".

The current output circuit 110 further includes diodes 114 (i.e., an example of "a constant voltage element having temperature characteristics"), which are disposed between the power supply terminal P2 and the internal ground generator 23, and to which a constant voltage Vb, corresponding to the difference determined by subtracting the internal ground GND2 from the power supply voltage Vcc, is applied. Further included are a constant current circuit 120, a pair of FETs 115, 116 which form a current mirror circuit, and a second resistor 117 that is disposed between the ends of the diodes 114 and serially connected to the downstream side of the FET 115 (i.e., an FET on which diode connection is formed). Thereby, a second current Ib(=(Vb−Vt)/Rb, where Vt is a drain-to-source voltage of the FET 115 and Rb is a resistance value of the second resistor 117) corresponding to the constant voltage Vb can pass through the FET 116. The FETs 115, 116 and the second resistor 117 function as "a second current output circuit", while the plurality of serially-connected diodes 114 function as "a constant voltage circuit".

The current output circuit 110 further includes a pair of FETs 118, 119 which form a current mirror circuit. The drain of the FET 118, on which diode connection is formed, is connected to the drain of the FET 112 so that the first current Ids can pass into the FET 118. The drain of the FET 119 is connected to the drain of the FET 116. Thereby,. a third current Ic(=Ib−Ids) corresponding to the difference determined by subtracting the first current Ids from the second current Ib can be outputted from the connecting point X between the FETs 116, 119. The FETs 118, 119 function as "a third current output circuit".

A plurality of threshold setting resistors (e.g., seven threshold setting resistors 60b-60h in the present embodiment) are serially connected between the connecting point X, between the FETs 116, 119, and the ground terminal P6, so that the third current Ic can pass through the threshold setting resistors 60b-60h. Divided voltages at the respective connecting points B-G between the threshold setting resistors 60b-60h vary directly with the third current Ic (=Ib−Ids), i.e., in proportion to a voltage corresponding to the difference determined by subtracting the drain-to-source voltage Vds of the power MOSFET 14 from the constant voltage Vb. According to the construction, the first anomaly threshold current ILoc decreases with increase of the drain-to-source voltage Vds of the power MOSFET 14, and increases with a decrease.

The threshold voltage generator 52 further includes a plurality of FETs 61a-61f as switching elements for connecting the other input terminal of the comparator 58 selectively to the connecting points B-G between the resistors 60b-60h. Thereby, the first anomaly threshold voltage Voc can be decreased stepwise by turning on the FETs 61a-61f selectively and sequentially. The ON-OFF switching of the FETs 61a-61f is controlled by the control logic portion 27 as described below.

On the other hand, the second anomaly threshold voltage Vfc varies with the source voltage Vs of the power MOSFET 14. Specifically, a plurality of voltage-dividing resistors (e.g., three voltage-dividing resistors 60a, 60i, 60j in the present embodiment) are serially connected between the source of the power MOSFET 14 and the ground terminal P6. The divided voltage at the connecting point A between the voltage-dividing resistors 60a and 60i is outputted as the second anomaly threshold voltage Vfc.

In the present embodiment, in order that the second anomaly threshold current ILfc is biased so as not to decrease to a negative level with variation of the load resistance of the load 11, an FET 62, which is a switching element that turns on in response to a bias signal Bias from the control logic portion 27, is provided, through which a current passes from the power source 12 into the voltage-dividing resistors 60a, 60i via a resistor 63. The bias signal Bias is outputted from the control logic portion 27 for turning on the FET 62, when a low-level control signal S1 or a low-level output signal S2 is outputted. Specifically, an AND circuit 69, to which a control signal S1 and an output signal S2 of the clear counter 72 are inputted, is provided in the control logic portion 27 as described below with reference to FIG. 6, and the AND circuit 69 can output the bias signal Bias. Meanwhile, biasing of the first anomaly threshold current ILoc can be achieved by designing so that 'Ib−Ids>0' is satisfied. Thereby, the second current Ib can function as a bias.

Figure 5:
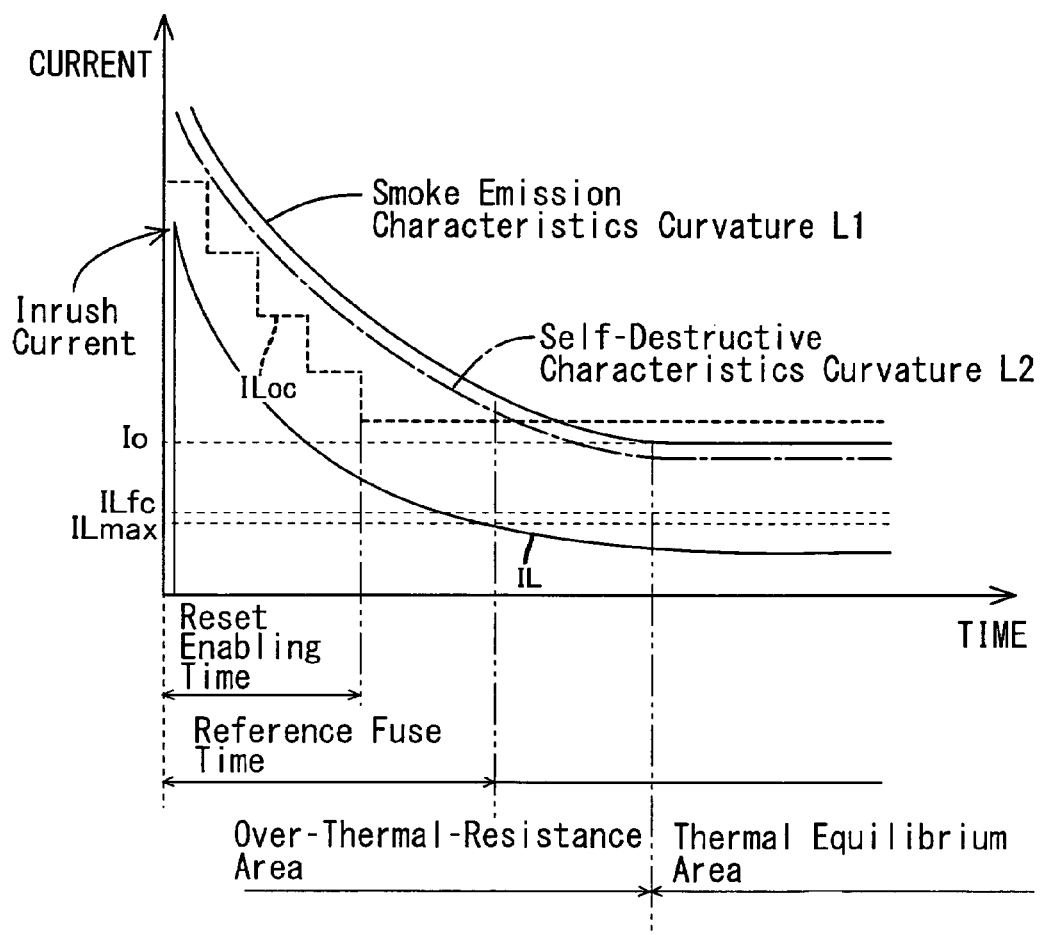
[FIG. 5] is a graph for explanation of setup levels of a first anomaly threshold current and a second anomaly threshold current.

FIG. 5 is a graph for explanation of setup levels of the first anomaly threshold current ILoc and the second anomaly threshold current ILfc. The graph relates to the smoke emission characteristics of an electric wire 30 (e.g., a coating material of the electric wire) connectable to the power supply controller 10, in which the smoke emission characteristics curvature L1 representing the relation between a constant current level and a current-applying time (i.e., a time taken for fusing) is shown. That is, the smoke emission characteristics curvature L1 represents the relation between an arbitrary constant current (one-shot current) and a time taken for the coating material of the electric wire 30 to begin to burn while the constant current is applied to the electric wire 30. In the graph, a self-destructive characteristics curvature L2 is also shown, which represents the relation between an arbitrary constant current (one-shot current) and a time taken for the power MOSFET 14 to break while the constant current is applied to the MOSFET 14. The second anomaly threshold current ILfc is set to a value within the area where a current level is lower than the smoke emission characteristics curvature L1 and the self-destructive characteristics curvature L2. The first anomaly threshold current ILoc is set to a value within the area where a current level is lower than the smoke emission characteristics curvature L1 and the self-destructive characteristics curvature L2, for a time domain corresponding to a reference FUSE time described below beginning with start of count from the initial value by a fuse time counter 73.

Note that the smoke emission characteristics shown in the graph relates to an electric wire 30 selected from electric wires 30 likely connected to the power supply controller 10. The smoke emission characteristics depends on an external circuit (e.g., a wiring member such as an electric wire, or a load) to be connected to the power supply controller 10. Therefore values of the load current IL and the sense current Is, based on which the above low-level output signals FC, OC are outputted, should be also changed depending thereon. However, that can be readily achieved by adjusting the resistance of the above-described external resistor 16.

In the graph, ILmax represents the rated current of the load 11 (i.e., a current value corresponding to a limit of use of the device against which the design thereof is guaranteed). Io represents the equilibrium critical current that can be applied while maintaining a thermal equilibrium state in which heat generation and radiation in the electric wire 30 are balanced. If a current of a higher level than the equilibrium critical current Io is applied, that relates to the over-thermal-resistance area in which a current level and a time taken for burn are substantially in inverse proportion to each other. The second anomaly threshold current ILfc is set to a value slightly higher than the rated current ILmax of the load 11 as shown in FIG. 5. The comparator 59 detects a fuse current when the load current IL reaches the second anomaly threshold current ILfc, and outputs a low level output signal FC. If the load current IL is around the second anomaly threshold current ILfc, the power MOSFET 14 does not need to be turned OFF immediately. It should be turned OFF, only if the fuse current state continues for a considerable time as described below.

In contrast, the first anomaly threshold current ILoc is set to a level higher than the second anomaly threshold current ILfc. The comparator 58 detects an overcurrent when the load current IL reaches the first anomaly threshold current ILoc, and outputs a low level output signal OC. When the load current IL is such a high level as to exceed the first anomaly threshold current ILoc, the power MOSFET 14 should be turned OFF immediately as described below. In preparation for an inrush current, the threshold voltage generator 52 first sets the first anomaly threshold current ILoc to an initial level higher than the inrush current as shown in FIG. 5. Thereafter, if a fuse current is detected as described below, the first anomaly threshold current is decreased stepwise with time.

(Overheat Detector)

The overheat detector 25 receives a temperature signal S4 corresponding to a temperature of the power chip 20 from the temperature sensor 19 provided on the power chip 20. The overheat detector 25 detects a temperature anomaly when the received temperature signal S4 exceeds a predetermined threshold temperature, and provides a low-level output signal OT to the control logic portion 27.

During a first or second forcing shutoff operation being performed for the power MOSFET 14 by the control logic portion 27 in response to an occurrence of a current anomaly or a temperature anomaly as described below, the diagnostic output portion 26 provides a diagnostic output by pulling down the diagnostic output terminal P7 to a low level in response to a high-level diagnostic signal Diag from the control logic portion 27. Thereby, notification of the forcing shutoff state of the power MOSFET 14 due to the occurrence of a current anomaly or a temperature anomaly or due to the fuse function being performed can be provided to the outside.

(Control Logic Portion)

Figure 6:
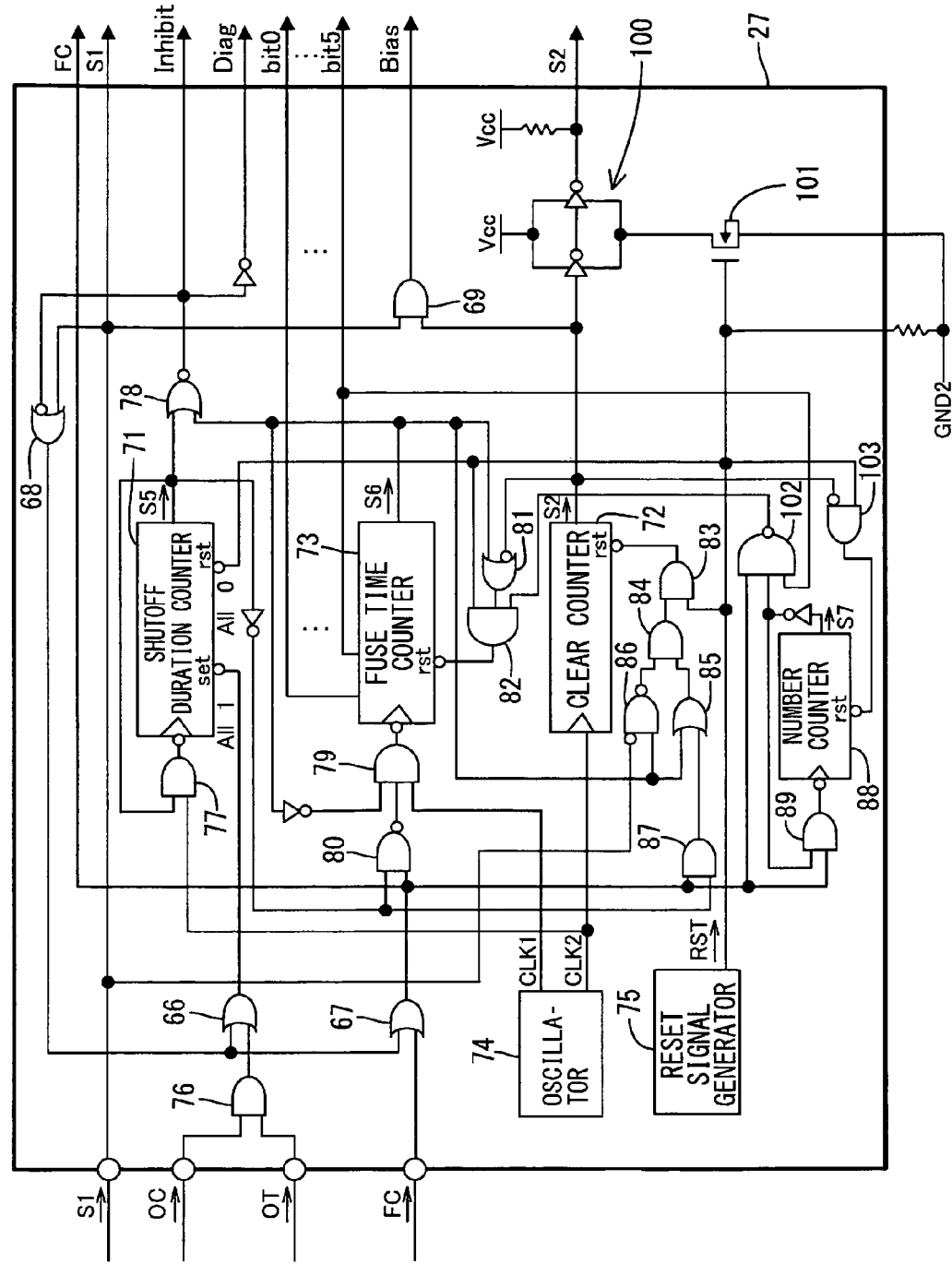
[FIG. 6] is a circuit diagram of a control logic portion.

FIG. 6 is a circuit diagram of the control logic portion 27. The control logic portion 27 mainly includes a shutoff duration counter 71, the clear counter 72, the fuse time counter 73, an oscillator 74, a reset signal generator 75, a number counter 88 and the like. The control logic portion 27 receives the control signal S1 from the input interface 22, the output signals OC, FC from the current detector 24, and the output signal OT from the overheat detector 25 as described above.

a. Oscillator and Reset Signal Generator

The oscillator 74 generates and outputs two clock signals indifferent periods, i.e., a clock signal CLK1 (in 125 microsecond period, for example) and a clock signal CLK2 (in 4 millisecond period, for example). The reset signal generator 75 generates a constant voltage sufficient for the internal ground generator 23 and the present control logic portion 27 to operate. Further it outputs a low level output signal RST (i.e., a reset signal), unless and until clock generation of the oscillator 74 is stabilized. When the clock generation is stabilized, a high level output signal RST is outputted.

b. Shutoff Duration Counter

If at least one of a low-level output signal OC from the current detector 24 and a low-level output signal OT from the overheat detector 25 is received, the shutoff duration counter 71 as an overcurrent protective circuit forcibly performs a shutoff operation for the power MOSFET 14 for a predetermined reference OFF duration (i.e., a duration corresponding to the countdown from the count value "n" to "0", and specifically 32 milliseconds), and thereafter releases the forcing shutoff state. In the present embodiment, "forcing shutoff" means that the power MOSFET 14 is forcibly turned OFF although the power supply controller 10 is receiving a low-level control signal S1 (ON signal).

Specifically, the shutoff duration counter 71 counts down from the initial value n to zero in synchronization with clocking of the clock signal CLK2. The output signal RST from the reset signal generator 75 is inverted and inputted to the reset terminal of the shutoff duration counter 71. All the n counters thereof are reset to "0" (so that the count value is set to the initial value "n"), while the output signal RST is low level. The reset state is released, when the output signal RST turns to high level. The shutoff duration counter 71 outputs a low level output signal S5, when all the n counters are "0" (i.e., during the reset state or when the count value has overflowed). Otherwise, it outputs a high level output signal S5 for performing a forcing shutoff operation for the power MOSFET 14.

An output signal from an AND circuit 76, to which an output signal OC and an output signal OT are inputted, is validated by an OR circuit 66, and then inverted and inputted to the set terminal of the shutoff duration counter 71. The shutoff duration counter 71 sets all the n counters to "1", when a low level output signal OC due to an overcurrent occurrence or an output signal OT of low level due to a temperature anomaly is received. Then the shutoff duration counter 71 outputs a high-level output signal S5, and thereby an AND circuit 77 validates the clock signal CLK2 from the oscillator 74 so that a countdown operation in synchronization with the clocking is started. The shutoff duration counter 71 performs the countdown according to down edges of the clocking.

After the start of the countdown, the shutoff duration counter 71 outputs a high level output signal S5, unless and until the countdown to "0" is completed resulting in overflow. Thereby, the clock signal CLK2 is validated by the AND circuit 77 so as to be inputted to the clock terminal of the shutoff duration counter 71. At the time, a NOR circuit 78 provides a low level output signal Inhibit for the gate driver 28 in response to the high-level output signal S5, so that a forcing shutoff operation for the power MOSFET 14 is performed.

In contrast, the shutoff duration counter 71 outputs a low level output signal S5, if the countdown to "0" is completed resulting in overflow. Then input of the clock signal CLK2 is inhibited by the AND circuit 77. At the time, the NOR circuit 78 provides a high level output signal Inhibit for the gate driver 28 in response to the low-level output signal 5, so that the forcing shutoff state of the power MOSFET 14 is released. Thereby the power MOSFET 14 is restored to the conductive state, if the power supply controller 10 is receiving a low-level control signal S1 (ON signal).

Figure 8:
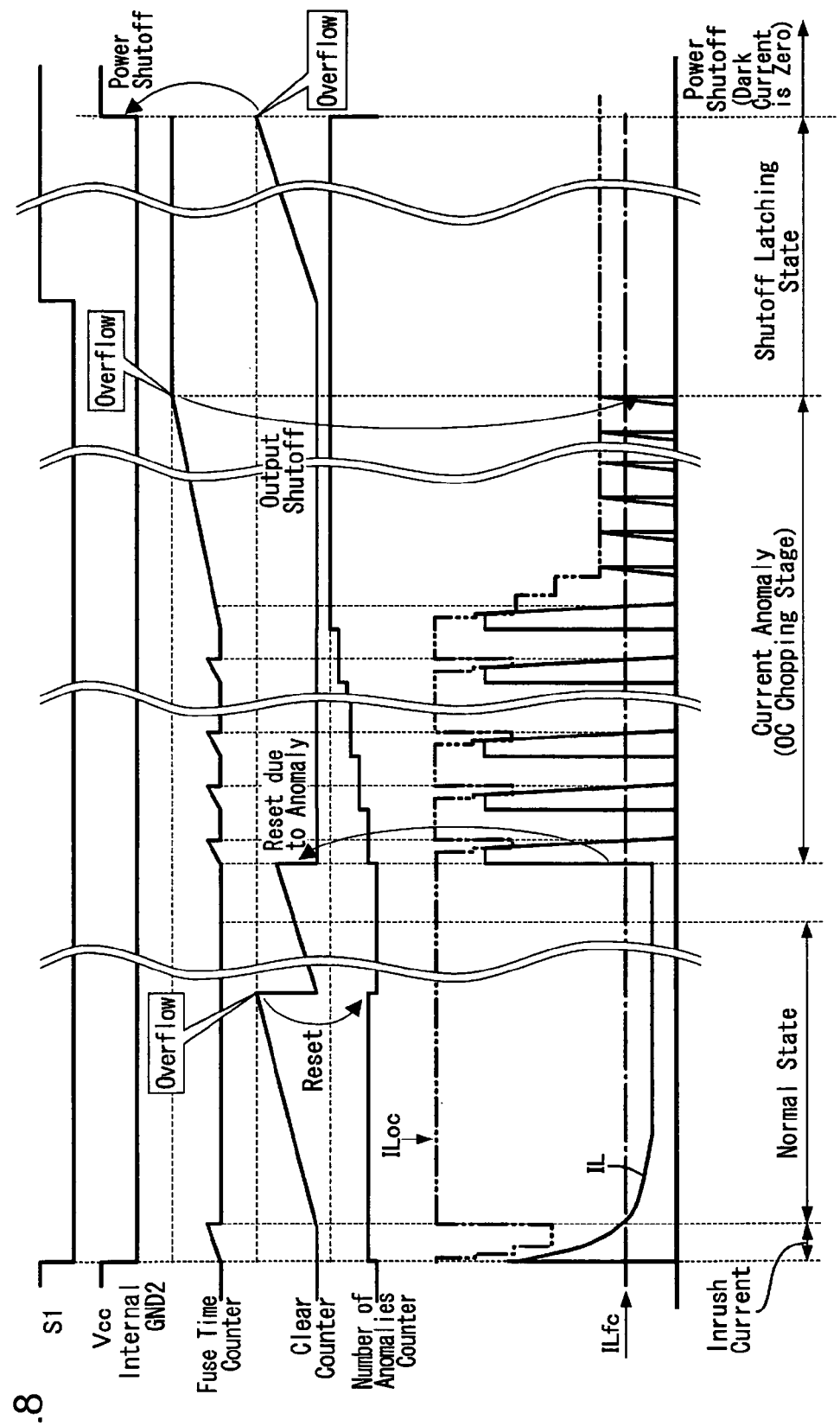
[FIG. 8] is a timing chart when the power supply controller receives a constant voltage signal of low level as a control signal.

As described above, the shutoff duration counter 71 immediately initiates a forcing shutoff operation for the power MOSFET 14 whenever the current detector 24 outputs a low level output signal OC in response to an overcurrent state, for example, and releases the forcing shutoff operation when the countdown from n is completed, as shown in FIG. 8 (See "OC Chopping Stage"). Hereinafter, this forcing shutoff, from which the power MOSFET 14 is restored to the conductive state by the shutoff duration counter 71 when a predetermined reference OFF duration has elapsed, is referred to as "first forcing shutoff".

c. Fuse Time Counter

The fuse time counter 73 as an anomaly time accumulator circuit accumulates an anomaly time (hereinafter referred to as "a FUSE time") during which a low level output signal FC is received from the current detector 24 or first forcing shutoff is performed for the power MOSFET 14 by the shutoff duration counter 71. A forcing shutoff operation is performed for the power MOSFET 14, if the accumulated time reaches a predetermined reference FUSE time (which is larger than the reference OFF duration and corresponds to the count from "0" to "m(>n)", and specifically which is 1024 milliseconds).

Specifically, the fuse time counter 73 counts from the initial value 0 to m in synchronization with clocking of the clock signal CLK1. The fuse time counter 73 performs the count according to down edges of the clocking. More specifically, the fuse time counter 73 outputs a low level output signal S6 during the count-up operation, and outputs a high level output signal S6 (i.e., a shutoff signal) if the count to "m" is completed resulting in overflow. The level-inverted signal of an output signal S6 of the fuse time counter 73 and an output signal of a NAND circuit 80 are inputted to an AND circuit 79 provided for validating the clock signal CLK1 from the oscillator 74. The NAND circuit 80 outputs a high-level signal, when a low level output signal FC or a low-level signal, generated by level-inverting a high-level output signal S5 outputted when the shutoff duration counter 71 is performing the countdown operation, is received. The NAND circuit 80 receives the output signal FC via an OR circuit 67.

Therefore, when a low level output signal FC is outputted or the shutoff duration counter 71 is performing the countdown operation, the AND circuit 79 validates the clock signal CLK 1 so that the fuse time counter 73 progresses the count-up operation unless it overflows. If the fuse time counter 73 completes the count to "m" resulting in overflow, it thereafter outputs a high level output signal S6. At the time, the NOR circuit 78 provides a low level output signal Inhibit for the gate driver 28 in response to the high-level output signal S6, so that a forcing shutoff operation is performed for the power MOSFET 14. Hereinafter, this forcing shutoff due to overflow of the fuse time counter 73 is referred to as "second forcing shutoff". Then the overflow state of the fuse time counter 73 is maintained, because input of the clock signal CLK1 is inhibited due to the high-level output signal S6. Thus the fuse time counter 73 functions also as an output latch circuit.

The count value of the fuse time counter 73 is reset to the initial value "0" in any of the following cases (1) to (3):

(1) A low level output signal RST is outputted from the reset signal generator 75 (for a reset state);
(2) (Except when the fuse time counter 73 has overflowed) a high level output signal S2 (i.e., a clear signal) has been outputted from the clear counter 72 (that is, the clear counter 72 has overflowed); and
(3) (Except when the accumulated time as the FUSE time has reached a reset enabling time) a fuse current is eliminated, without overflow of the number counter 88 described below, so that a high level output signal FC is received. This reset condition (3) will be described later.

Specifically, the level-inverted signal of an output signal S2 from the clear counter 72 and an output signal S6 of the fuse time counter 73 are inputted to an OR circuit 81. An output signal of the OR circuit 81 and an output signal RST of the reset signal generator 75 are inputted to an AND circuit 82. An output signal thereof is level-inverted and inputted to the reset terminal of the fuse time counter 73. Thereby, the count value of the fuse time counter 73 is consistently reset to the initial value "0", when a low level output signal RST is outputted from the reset signal generator 75. An output signal from a NAND circuit 102 is also inputted to the AND circuit 82 as described below.

On the other hand, while a high level output signal RST is outputted from the reset signal. generator 75, the count value is reset to the initial value "0" in response to a high level output signal S2 from the clear counter 72 unless the fuse time counter 73 has overflowed. In contrast, when the fuse time counter 73 has overflowed, its count value will not be reset even if a high level output signal S2 is outputted from the clear counter 72, so that the second forcing shutoff state is maintained.

As shown in FIG. 7, the fuse time counter 73 outputs a signal according to the accumulated time (i.e., the count value) accumulated by the count-up operation, or specifically it outputs low-level bit signals "bit 0" to "bit 5" sequentially. Thereby the FETs 61a to 61f are turned on sequentially and selectively, so that the threshold voltage generator 52 decreases the first anomaly threshold voltage Voc (and the first anomaly threshold current ILoc) stepwise with time according to the accumulated time. The accumulated time, at the time a low-level bit signal bit5 is outputted, corresponds to the reset enabling time (which is shorter than the reference FUSE time, and 16 milliseconds in the present embodiment, for example). As shown in FIG. 5, the reset enabling time is set based on the time, around which the self-destructive characteristics curvature L2 changes to have a measure of gentleness.

d. Clear Counter

The clear counter 72 as a normal duration accumulator circuit mainly resets the accumulated time (i.e., the count value) of the fuse time counter 73 to the initial value "0", if a normal state, in which neither a current anomaly nor a temperature anomaly is detected (i.e., the load current IL is a normal level lower than the second anomaly threshold current ILfc and the first anomaly threshold current ILoc), continues for a predetermined reference NORMAL duration (corresponding to the countdown from "0" to "q", or specifically corresponding to 512 milliseconds) without overflow being reached after the fuse time counter 73 starts the count. Specifically, the clear counter 72 counts from the initial value "0" to "q (<n)" in synchronization with clocking of the clock signal CLK2. The clear counter 72 performs the count according to up edges of the clocking. The reference NORMAL duration is determined based on the time taken for elimination of the overheat state of the load and the like after elimination of a fuse current or overcurrent state, for example.

The count value of the clear counter 72 is reset to the initial value "0", when the reset signal generator 75 outputs a low level output signal RST (for a reset state). It is also reset when a low level output signal FC is received from the current detector 24 or forcing shutoff is performed for the power MOSFET 14 by the shutoff duration counter 71, unless the fuse time counter 73 has overflowed after start of its count-up operation. On the other hand, after overflow of the fuse time counter 73, reset is performed in response to a low level control signal S1 (ON signal).

Specifically, the clear counter 72 directly receives the clock signal CLK 2 from the oscillator 74, and normally outputs a low level output signal S2. If the count to "q" is completed resulting in overflow, a high level output signal S2 is outputted for one clocking period, for example. An output signal RST from the reset signal generator 75 is inputted to an AND circuit 83, and an output signal thereof is level-inverted and applied to the reset terminal of the clear counter 72. Thereby the count value is reset to the initial value "0", when the reset signal generator 75 outputs a low level output signal RST.

An output signal from an AND circuit 84 is inputted to the AND circuit 83. An output signal from an OR circuit 85 and an output signal from a NAND circuit 86 are inputted to the AND circuit 84. An output signal from an AND circuit 87 and an output signal S6 from the fuse time counter 73 are inputted to the OR circuit 85. An output signal FC and the level-inverted signal of an output signal S5 of the shutoff duration counter 71 are inputted to the AND circuit 87. According to this construction, unless the fuse time counter 73 has overflowed after start of its count-up operation, the count value of the clear counter 72 is reset when a low level output signal FC due to a fuse current is received or when first forcing shutoff for the power MOSFET 14 is performed by the shutoff duration counter 71, as described above.

An output signal S6 of the fuse time counter 73 and the level-inverted signal of a control signal S1 are inputted to the NAND circuit 86. Thereby the clear counter 72 is reset, when a low level control signal S1 (ON signal) is received after overflow of the fuse time counter 73 as described above.

e. Number Counter

The number counter 88 as a threshold initialization circuit mainly performs an initialization operation for restoring the first anomaly threshold voltage Voc (and the first anomaly threshold current ILoc), which have been decreased stepwise with time, to the initial level, if a high level output signal FC is received due to elimination of a fuse current after a low level output signal FC is received due to the fuse current. The initialization operation is performed x times (e.g., seven times in the present embodiment) at most.

Specifically, the number counter 88 counts the number of times a low level output signal FC is inputted to the control logic portion 27, up to y(=X+1), for example. The number counter outputs a low level output signal S7 unless and until overflow is reached, and outputs a high level output signal S7 when it has overflowed. An output of an AND circuit 89 is level-inverted and inputted to the number counter 88. An output signal FC and the level-inverted signal of an output signal S7 of the number counter 88 are inputted to the AND circuit 89. An output signal FC, the level-inverted signal of an output signal S7 of the number counter 88 and a bit signal bit5 described above are inputted to the NAND circuit 102. An output signal of the NAND circuit 102 is applied to the AND circuit 82 described above.

According to this construction, when a high level bit signal bit5 is received from the fuse time counter 73 (i.e., unless and until the accumulated time of the fuse time counter 73 reaches the reset enabling time), the number counter 88 increments its count value one by one at times when a low level output signal FC is inputted to the AND circuit 89 unless its count value has overflowed. At this time, a low level output signal FC, a high-level signal generated by level-inverting an output signal S7 of the number counter 88, and the high-level bit signal "bit5" are inputted to the NAND circuit 102.

When a high level output signal FC is inputted due to elimination of a fuse current, an output signal of low level from the NAND circuit 102 is inputted to the AND circuit 82 so that the accumulated time (i.e., the count value) of the fuse time counter 73 is reset to the initial value "0" (because of the above reset condition (3) described in "c. Fuse Time Counter"). Thus the initialization operation for restoring the first anomaly threshold voltage Voc (and the first anomaly threshold current ILoc) to the initial level is performed.

On the other hand, when the count value of the number counter 88 has overflowed, a low-level signal generated by level-inverting an output signal S7 of the number counter 88 is inputted to the NAND circuit 102. Thereby a high-level output signal is inputted from the NAND circuit 102 to the AND circuit 82 irrespective of whether the output signal FC and the bit signal "bit5" are high level or low level. Then the accumulated time of the fuse time counter 73 is reset by the number counter 88, i.e., the initialization operation cannot be performed.

Further, when a low level bit signal bit5 is received from the fuse time counter 73 (i.e., when the accumulated time of the fuse time counter 73 reaches the reset enabling time), a high-level output signal is inputted from the NAND circuit 102 to the AND circuit 82 irrespective of whether the output signal FC and the level-inverted signal of the output signal S7 of the number counter 88 are high level or low level. Then the accumulated time of the fuse time counter 73 is reset by the number counter 88, i.e., the initialization operation cannot be performed, even if the count value of the number counter 88 has not overflowed. Thus the number counter 88 and the NAND circuit 102 function as "a reset disabling circuit".

The level-inverted signal of an output signal from an AND circuit 103 is inputted to the reset terminal of the number counter 88. The level-inverted signal of an output signal S2 from the clear counter 72 and an output signal RST from the reset signal generator 75 are inputted to the AND circuit 103. According to this construction, the count value of the number counter 88 is reset to zero while the reset signal generator 75 outputs a low level output signal RST (i.e., a reset signal). On the other hand, during a high level output signal RST being outputted from the reset signal generator 75, the count value of the number counter 88 is reset to zero when the clear counter 72 outputs a high level output signal S2 (i.e., a clear signal) due to its overflow. Thus, the clear counter 72 functions as "a number reset circuit".

f. Invalidation Circuit

As shown in FIG. 6, the control logic portion 27 includes an OR circuit 68, to which a control signal S1 and the level-inverted signal of an output signal Inhibit are inputted. The output signal thereof is inputted to the OR circuits 66 and 67 described above. According to this construction, the OR circuit 68 outputs a high-level output signal, when a high level control signal S1 (OFF signal) is inputted. Thereby the outputs of the OR circuits 66, 67 are maintained at a high level, even if the overcurrent anomaly detector 53 outputs a low-level output signal OC or the overheat detector 25 outputs a low-level output signal OT. That is, the low-level output signal OC and the low-level output signal OT are invalidated (i.e., masked). Thus, the OR circuits 66 to 68 function as an invalidation circuit.

(Gate Driver)

To the gate driver 28, the control signal S1, the output signal FC and the output signal Inhibit are inputted from the control logic portion 27. The gate driver 28 includes a charge pump (not shown) connected between the power supply terminal P2 and the gates of the power MOSFET 14 and sense MOSFET 18, and further includes a discharge FET (not shown) connected between the gates and sources of the power MOSFET 14 and sense MOSFET 18.

When the gate driver 28 receives a low level control signal S1 (ON signal) from the control logic portion 27, the charge pump (not shown) solely operates so as to apply a higher voltage, generated from the power supply voltage Vcc, to between the gate and source of each of the power MOSFET 14 and the sense MOSFET 18. Thus, a charging operation is performed for turning ON the power MOSFET and the sense MOSFET, resulting in a conductive state. On the other hand, when the gate driver 28 receives a high level control signal S1 (OFF signal) from the control logic portion 27 or when it receives a low level output signal Inhibit (i.e., when the first or second forcing shutoff should be performed), the charge pump discontinues generation of a higher voltage while the discharge FET is solely turned on, so that the charge between the gate and source of each of the power MOSFET 14 and the sense MOSFET 18 is released. Thus a discharging operation, i.e., a shutoff operation is performed.

2. Operation of the Present Embodiment (In case of an inrush current that will not exceed the temporally changing first anomaly threshold current ILoc)

FIG. 8 is a timing chart concerning the case that the power supply controller 10 receives a constant voltage signal of low level as a control signal S1. In response to the low level control signal S1, the internal ground generator 23 generates the internal ground GND2. When the internal ground GND2 is stabilized, the reset signal generator 75 outputs a high level output signal RST so that the reset state of each of the counters 71-73, 88 is released.

The low-level control signal S1 is applied to the gate driver 28, and thereby the power MOSFET 14 and the like are turned on resulting in a conductive state. Then an inrush current higher than the second anomaly threshold current ILfc passes into the power MOSFET 14. However, a first forcing shutoff operation (due to the inrush current) can be prevented from being performed for the power MOSFET 14 and the like, because the initial level of the first anomaly threshold current ILoc is higher than the inrush current.

The fuse time counter 73 starts a count-up operation, because the load current IL exceeds the second anomaly threshold current ILfc due to the occurrence of the inrush current. The count value is incremented until the load current IL falls below the second anomaly threshold current ILfc and, during this time, the first anomaly threshold current ILoc is decreased with time. In the present embodiment, the number counter 88 increments its count value by one at the time when the load current IL exceeds the second anomaly threshold current ILfc.

Thereafter, the accumulated time of the fuse time counter 73 is reset when the load current IL falls below the second anomaly threshold current ILfc, so that the initialization operation for restoring the first anomaly threshold current Iloc to the initial level is performed. If a normal state (See "Normal State" in FIG. 8), in which the load current IL is lower than the second anomaly threshold current ILfc, continues for a reference NORMAL duration, the clear counter 72 overflows and the count value of the number counter 88 is reset.

In the case of a construction wherein another semiconductor switching element on the current supply line 13 is provided on the downstream side (the load 11 side) of the power MOSFET 14 and repeatedly switched between on and off at predetermined time intervals (equal to or longer than the reference NORMAL duration) while maintaining the power MOSFET 14 ON, for example, an inrush current may occur repeatedly. Even in this case, a first forcing shutoff operation due to the inrush current can be prevented from being performed for the power MOSFET 14 and the like, because the first anomaly threshold current ILoc is restored to the initial level whenever the inrush current occurs.

In case that a current anomaly due to short-circuiting in the load 11 or the like occurs, the count-up operation by the fuse time counter 73 starts from the initial value when the load current IL exceeds the second anomaly threshold current ILfc. Then the first anomaly threshold current ILoc is decreased with time again, and the count value of the number counter 88 is incremented by one. When the load current IL during this anomaly exceeds the first anomaly threshold current ILoc, a first forcing shutoff operation is performed for the power MOSFET 14 and the like. Thereby the load current IL will fall below the second anomaly threshold current ILfc and, at this time, the initialization operation is performed.

When the shutoff duration counter 71 has overflowed (i.e., when a reference OFF duration has elapsed) after the initiation of the first forcing shutoff operation, the power MOSFET 14 and the like are restored to the conductive state. As long as the current anomaly state continues, the first forcing shutoff operation and restoration to the conductive state are repeated (See "OC Chopping Stage" in FIG. 8). In this stage, unless the repeat count of the initialization operation reaches seven (i.e., unless the number counter 88 completes the count to eight), the accumulated time of the fuse time counter 73 is reset and the first anomaly threshold current ILoc is restored to the initial level whenever the initialization operation is performed.

After the repeat count of the initialization operation reaches seven (i.e., after the number counter 88 completes the count to eight), the initialization operation is disabled so that the OC chopping can be performed according to the first anomaly threshold current ILoc of the lowest level which has been obtained by decreasing that with time. Then an overcurrent can be detected based on the first threshold current ILoc of the lowest level. If the overcurrent or fuse current state continues resulting in overflow of the fuse time counter 73, a second forcing shutoff operation is performed for the power MOSFET 14 and the like.

Note that the second anomaly threshold current ILfc is set to a level slightly higher than the rated current ILmax of the load 11. The reference FUSE time is set to a time shorter than the time taken for the electric wire 30 to emit smoke when a fuse current, i.e., a current higher than the second anomaly threshold current ILfc, is intermittently detected at intervals shorter than the reference NORMAL duration. Therefore, a chattering short, i.e., an abnormal current that occurs in a fraction of the stranded wires of the electric wire 30 at intervals shorter than the reference NORMAL duration due to short-circuiting in the fraction of the stranded wires, can be detected without the electric wire 30 reaching smoke emission, so that the second forcing shutoff operation can be performed for the power MOSFET 14.

In a holding state wherein the second forcing shutoff is maintained, the clear counter 72 is reset while a low level control signal S1 is received, so as to output a low level output signal S2. Therefore, the count value of the fuse time counter 73 cannot be reset as long as a low level control signal S1 is inputted (See "Shutoff Holding State (Latching State)" in the figure). When the power supply controller 10 receives a high level control signal S1 (OFF signal), the clear counter 72 starts a count-up operation.

Then in the internal ground generator 23, the FET 41 turns off in response to the high-level control signal S1, while the FET 42 is maintained on because of a low-level output signal S2 so that the conductive state is maintained. Therefore, even in the case that a vehicle driver performs an operation after initiation of the second forcing shutoff so that a high level control signal S1 (OFF signal) is inputted and, immediately after that, a low level control signal S1 (ON signal) is inputted, for example, the second forcing shutoff state can be maintained if the time interval therebetween is shorter than the reference NORMAL duration.

On the other hand, if a high level control signal S1 (OFF signal) is inputted to the input terminal P1 continuously for a reference NORMAL duration, the clear counter 72 overflows so that a high level output signal S2 is applied to the internal ground generator 23. Then the operation thereof terminates. Thereby, reduction of the charge amount of the power source 12 (e.g., a vehicle battery), due to a dark current passing from the power source 12 into the ground via the internal ground generator 23, can be since prevented. At the time, the reset signal generator 75 outputs a low level output signal RST so that the count value of each of the counters 71-73, 88 is reset. In response to the low level output signal RST, an FET 101 turns off so that a high-level holding circuit 100 operates. Thereby the output signal S2 is fixed to high level, and therefore generation of the internal ground GND2 by the internal ground generator 23 is maintained off although the count value of the clear counter 72 is reset.

(In Case of an Inrush Current That Will Exceed the Temporally Changing First Anomaly Threshold Current ILoc)

In order to prevent self-destruction of the power MOSFET 14, the level of the first anomaly threshold current ILoc changing with time should be set to values within the area where a current level is lower than the self-destructive characteristics curvature L2, for a time domain corresponding to the reference FUSE time, as described above. Further, the initial level of the first anomaly threshold current ILoc should be set so as to be as high as possible in order that forcing shutoff due to an inrush current of the highest level is prevented. For meeting these requirements, in the present embodiment, the first anomaly threshold current ILoc is set to a level as close to the self-destructive characteristics curvature L2 as possible for a time domain corresponding to the reference FUSE time, so as to change along the self-destructive characteristics curvature L2 over time as shown in FIG. 5.

However, an inrush current changing more gradually than assumed in the design phase, i.e., than that shown in FIG. 5, may occur, if the load resistance during the start-up of the load is high for some reasons or if parts have a variation due to manufacturing reasons, for example. Specifically, in the case that the load 11 is a motor for a cooling fan or a wiper, for example, the inrush current may change gradually with time (i.e., the time constant may be large), if snow accumulates or ice forms on the cooling fan or the wiper resulting in high load resistance.

Figure 9:
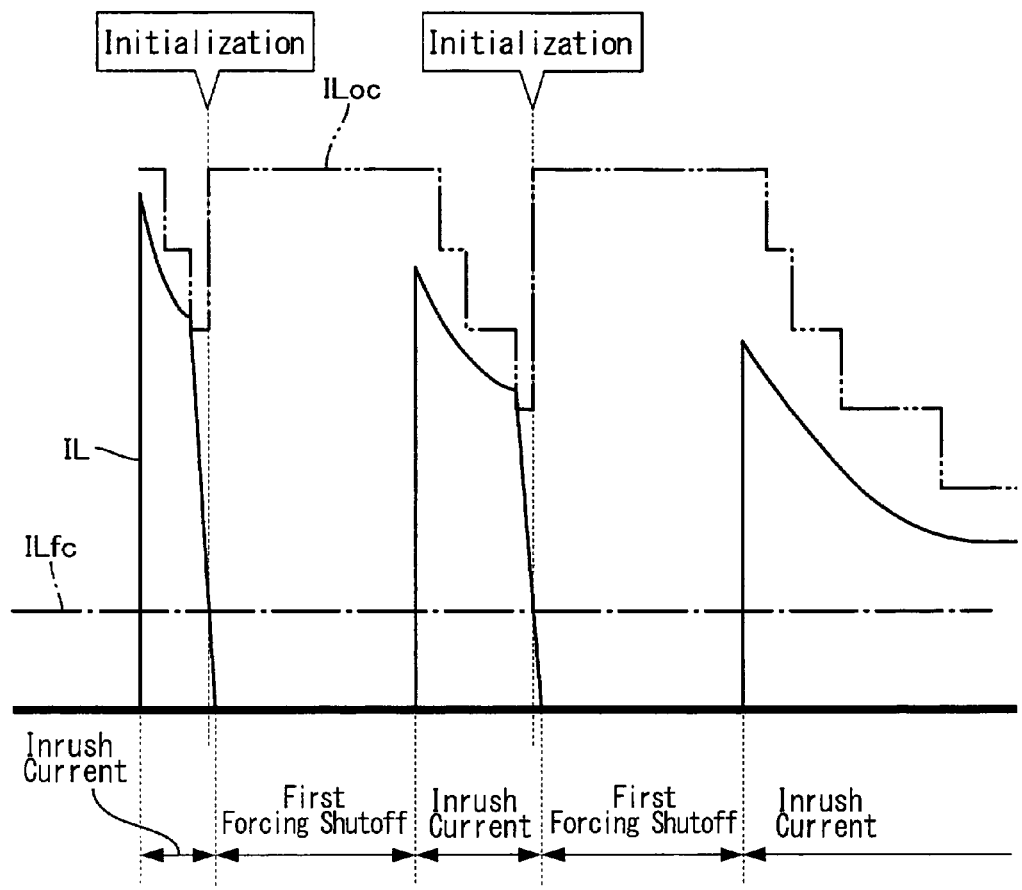
[FIG. 9] is a timing chart when an inrush current, which exceeds the first anomaly threshold current, has occurred.

In this case, as shown in FIG. 9, for example, the inrush current having occurred may exceed the first anomaly threshold current ILoc which has been decreased stepwise with time. Then a first forcing shutoff operation is performed for the power MOSFET 14 even in the power supply controller 10 according to the present embodiment. At the time, the initialization operation is performed for restoring the first anomaly threshold current ILoc to the initial level. If an inrush current occurs again when the power MOSFET 14 is restored to the conductive state after the first forcing shutoff operation, the initialization operation will be performed again. The initialization operation will be thus repeated several times and, during this time, the load resistance of the load 11 is gradually reduced due to the intermittent current supply. Then the repetition of current supply and immediate forcing shutoff terminates, so that normal control for power supply to the load 11 can be started.

Figure 10:
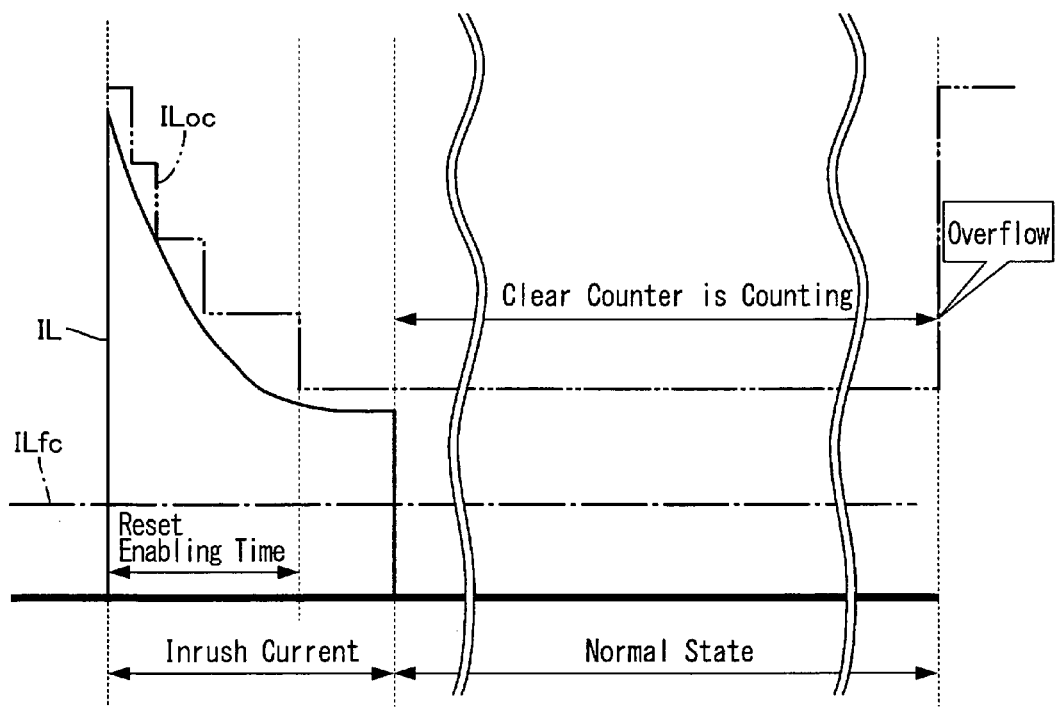
[FIG. 10] is a timing chart when an inrush current, which does not exceed the first anomaly threshold current and varies extremely gradually, has occurred.

Further, an inrush current, which continues not to be higher than the first anomaly threshold current ILoc but to be higher than the second anomaly threshold current Ilfc for a relatively long time, may occur, as shown in FIG. 10, for example. In this case, when the inrush current or the load current IL thereafter falls below the second anomaly threshold current ILfc resulting in a normal state, the initialization operation cannot be performed if the accumulated time of the fuse time counter 73 at the time is equal to or longer than the reset enabling time. That is, the accumulated time of the fuse time counter 73, having been accumulated, cannot be reset. While further accumulating the FUSE time, detection of an overcurrent can be performed based on the first anomaly threshold current ILoc which is of the lowest level as a result of having been decreased. This is because it is preferable to prioritize achievement of the fuse function (i.e., a protective function for an external circuit) when the FUSE time accumulated by the fuse time counter 73 thus reaches a considerable value. If the normal state continues for a reference NORMAL duration after the inrush current has died down, the clear counter 72 overflows as shown in FIG. 10. Then the accumulated time of the fuse time counter 73 is reset, and thereby the first anomaly threshold current ILoc is restored to the initial level.

(Measure Against Surges at the Time of OFF Signal Input)

For example, in the case that the load 11 is an L-load, the source voltage Vs of the power MOSFET 14 may be pulled to the negative side due to the surge voltage of the load 11 resulting in the drain-to-source voltage Vds higher than the power supply voltage Vcc, when the power MOSFET 14 is turned OFF in response to a high level control signal S1 (OFF signal). Therefore, the first anomaly threshold voltage Voc generated based on the drain-to-source voltage Vds of the power MOSFET 14, and the second anomaly threshold voltage Vfc generated based on the source voltage Vs may be also negative then. Then a low-level output signal OC or FC as an anomaly signal may be outputted from the overcurrent anomaly detector 53, even if an overcurrent or a fuse current has not occurred.

Therefore, in the case of a construction wherein an invalidation circuit described above is not provided, a first forcing shutoff operation may be performed so that the shutoff duration counter 71 causes shutoff of the power MOSFET 14 for a reference OFF duration. Consequently, there arises a problem that the power MOSFET 14 cannot be turned ON during the reference OFF duration even if a low level control signal S1 (ON signal) is inputted. However, in the present embodiment, the OR circuits 66, 68 invalidate the input of a low-level output signal OC, so that the input of a high-level signal to the set terminal of the shutoff duration counter 71 is maintained. Thereby, a first forcing shutoff operation can be prevented from being performed.

Further, in the construction that fails to include an invalidation circuit as described above, the fuse time counter 73 starts a count operation when a low-level output signal OC or FC is outputted as an anomaly signal from the overcurrent anomaly detector 53. Thereafter, a low-level signal OC or FC may be repeatedly outputted by error, if the power MOSFET 14 is turned ON in response to a low-level control signal S1 that can be inputted while a reference NORMAL duration is being counted. This could result in overflow of the fuse time counter 73, and then a second forcing shutoff operation described above may be performed even though a fuse current has not occurred. However, in the present embodiment, the OR circuits 67, 68 invalidate the input of a low-level output signal FC, so that the input of the clock signal CLK1 to the fuse time counter 73 is suspended. Thereby the count is prevented from being incremented, and consequently a second forcing shutoff operation can be prevented from being performed.

Alternatively, as a measure against surges at the time of OFF signal input, extremely high biases may be used as the above biases for generating the first anomaly threshold voltage Voc and the second anomaly threshold voltage Vfc by the threshold voltage generator 52. However, in this case, the first anomaly threshold voltage Voc or the second anomaly threshold voltage Vfc may fail to vary directly with the source voltage Vs of the power MOSFET 14, due to the bias voltage. Further, detection of a current anomaly may be delayed. For these reasons, the construction of the present embodiment is preferable.

(Speeding-up of Current Anomaly Detection Immediately After Turn-on of Power MOSFET)

FIGS. 11A, 11B, 12A and 12B show relationships among the drain-to-source voltage Vds of the power MOSFET 14, the first anomaly threshold current ILoc, and the load current IL(=k·Is) passing through the power MOSFET 14. The horizontal axis is a scale for the drain-to-source voltage Vds of the power MOSFET 14, while the vertical axis is a scale for the first anomaly threshold current ILoc and the load current IL which vary with the drain-to-source voltage Vds. In the figures, Line L8 is a varying threshold line that shows variation of the first anomaly threshold current ILoc according to the drain-to-source voltage Vds of the power MOSFET 14. Line L9 is an ON resistance line that shows variation of the load current IL which depends on the ON resistance of the power MOSFET 14. In the figures, the second and fourth graphs show cases when the power supply voltage Vcc has decreased by half compared to cases shown in the first and third graphs, respectively. The sense current Is varies directly with the load current IL, and therefore the following explanation will be made pointing to the load current IL as a representative example.

Figure 17:
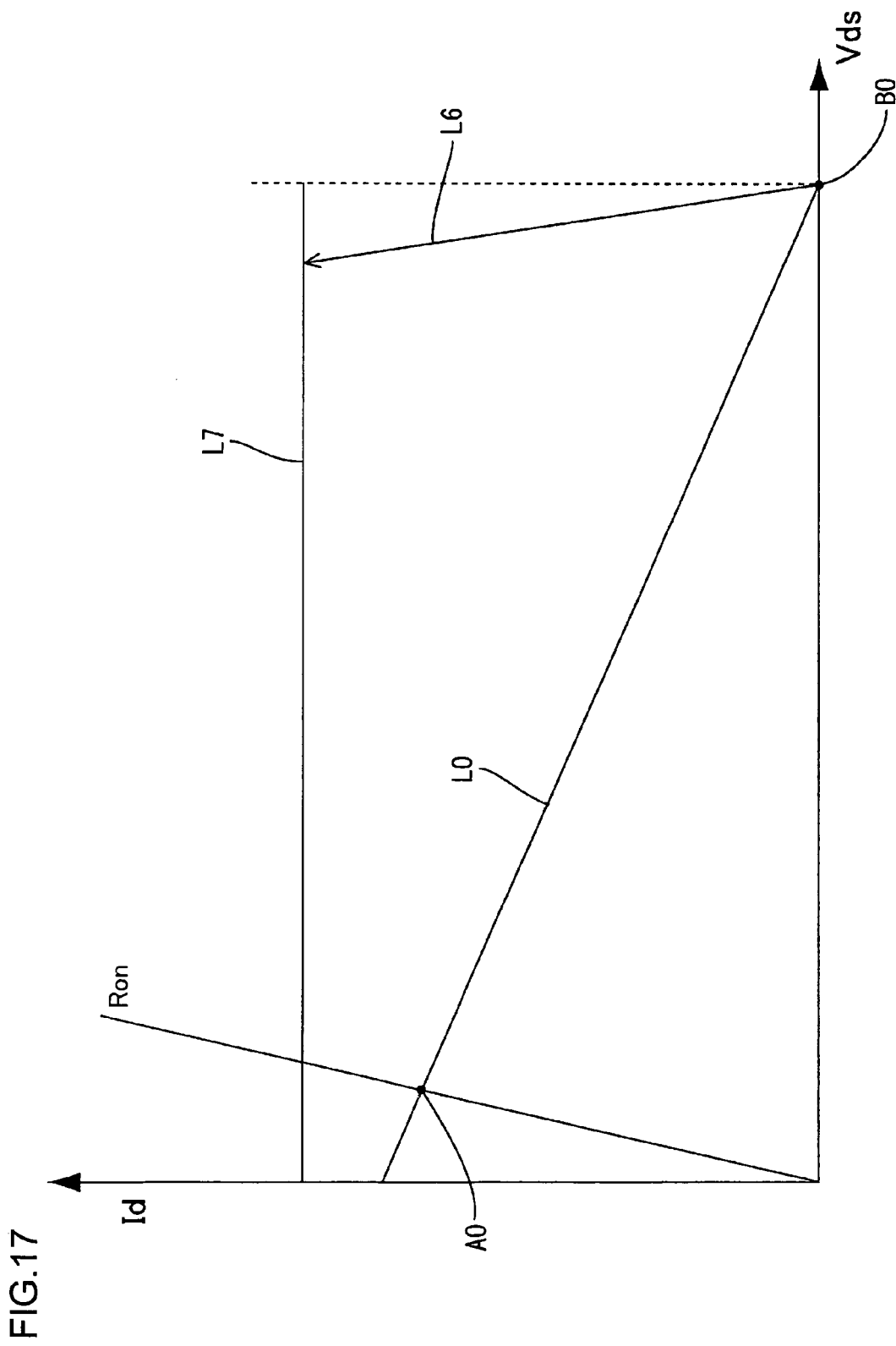
[FIG. 17] is an explanatory diagram showing the problem that arises when a threshold is set to a constant.

If short-circuiting has occurred, for example, in the load 11 immediately after turn-on of the power MOSFET 14, the source voltage Vs of the power MOSFET 14 will thereafter rise very little. That is, the drain-to-source voltage Vds varies little so as to be maintained high. In this case, if the threshold current is set to a fixed level (as shown in FIG. 17) so as to cover the entire load line as described above, it requires time before the load current reaches the threshold current. This could result in great power loss in the power MOSFET 14, and cause delay in protection.

Figure 11A:
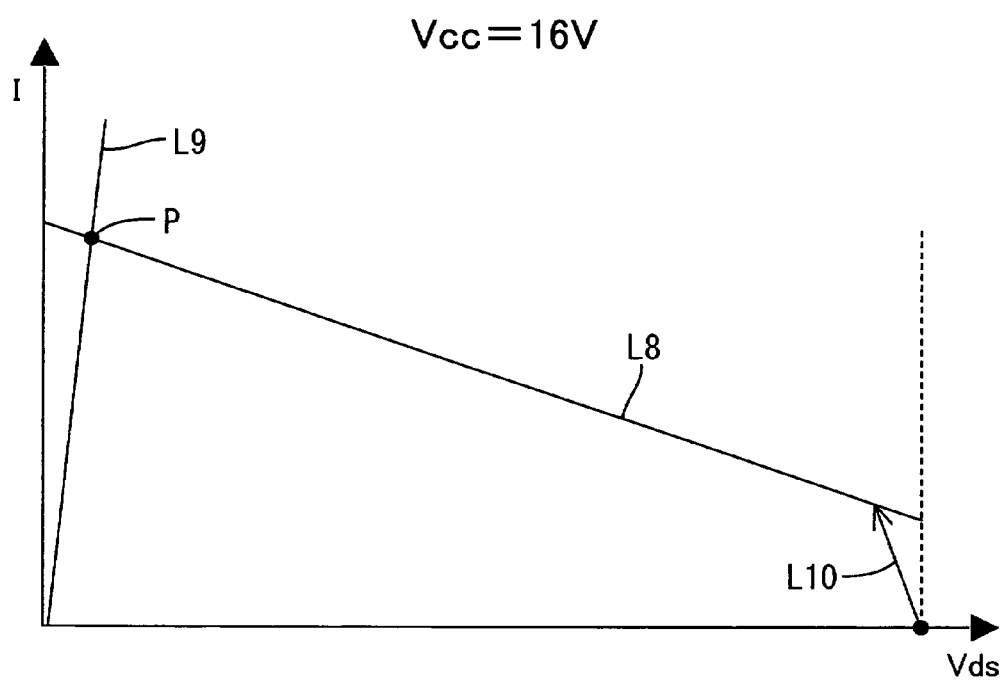
[FIG. 11A] is a graph showing a relationship among the drain-to-source voltage of a power MOSFET, the first anomaly threshold current and a load current IL (a first example)
Figure 11B:
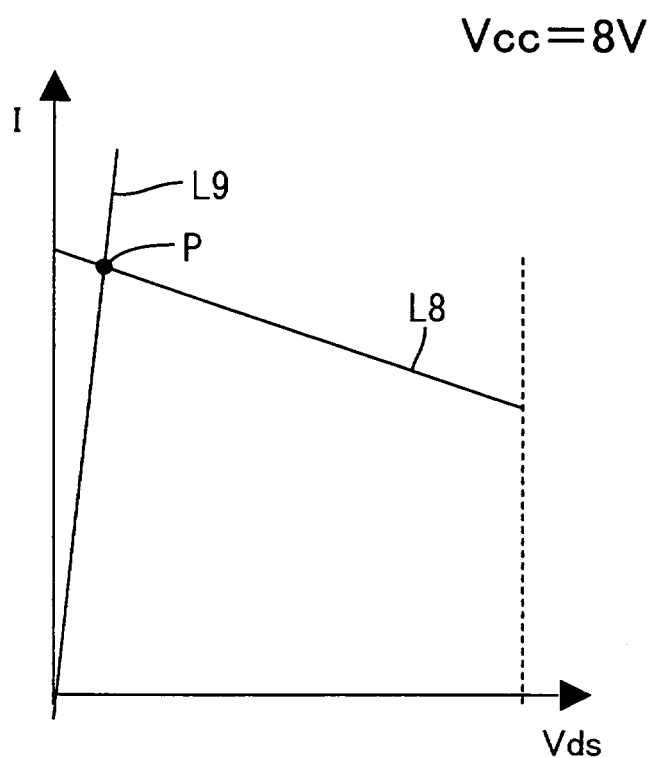
[FIG. 11B] is a graph showing a relationship among the drain-to-source voltage of the power MOSFET, the first anomaly threshold current and the load current IL (a second example)

In contrast, according to the present embodiment, the first anomaly threshold current ILoc is set by the threshold voltage generator 52 so as to change linearly according to the drain-to-source voltage Vds of the power MOSFET 14 as shown in FIGS. 11A and 11B, while the second anomaly threshold current ILfc is set so as to change linearly according to the source voltage Vs of the power MOSFET 14. That is, they are set to be lower for the domain of the voltage Vds being higher, and set to be higher for the domain of the voltage Vds being lower. Therefore, even when short-circuiting has occurred in the load 11 immediately after turn-on of the power MOSFET 14, the load current IL can reach the first anomaly threshold current ILoc and the like (as shown by a load line L10 in FIG. 11A) without reaching a high level, i.e., when it is relatively low level, because the first anomaly threshold current ILoc and the like are then set to a relatively low level according to the drain-to-source voltage Vds being relatively high. Thereby, a low-level output signal OC, FC can be outputted early from the current detector 24.

Figure 12A:
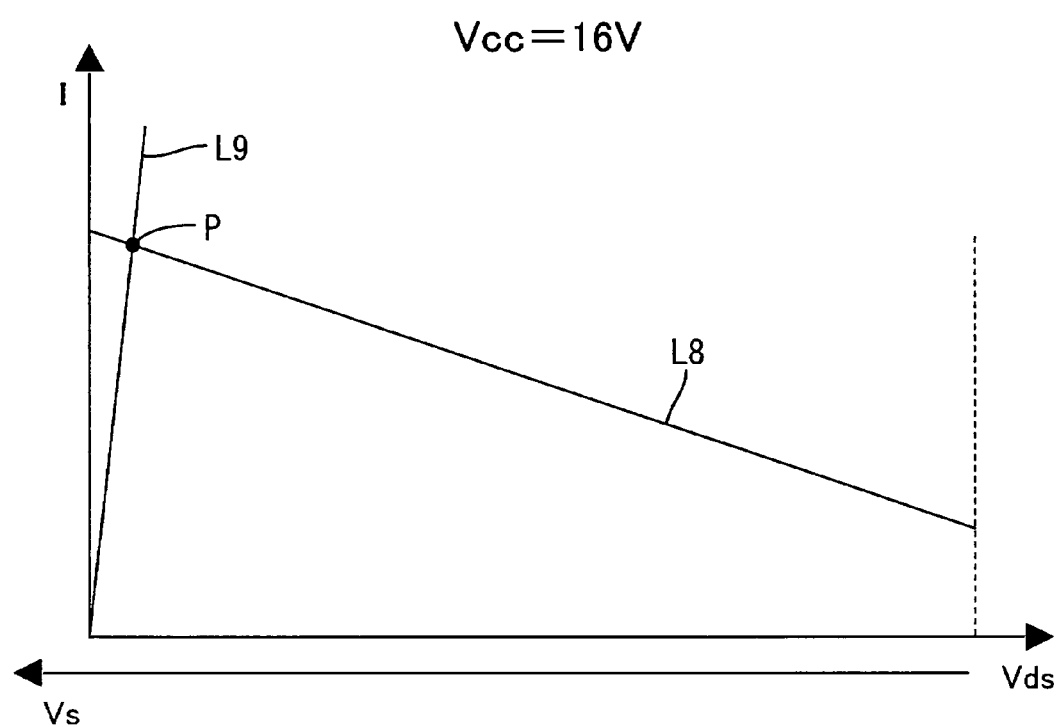
[FIG. 12A] is a graph showing a relationship among the drain-to-source voltage of the power MOSFET, the first anomaly threshold current and the load current IL (a third example)
Figure 12B:
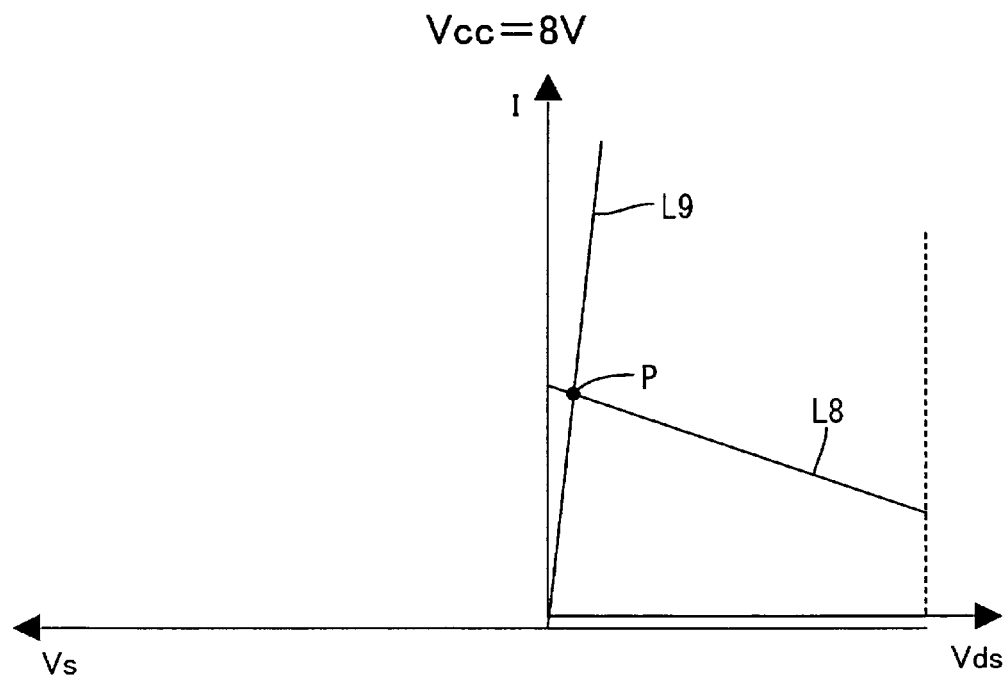
[FIG. 12B] is a graph showing a relationship among the drain-to-source voltage of the power MOSFET, the first anomaly threshold current and the load current IL (a fourth example)

Rapid detection of a current anomaly, when short-circuiting in the load has occurred immediately after turn-on of the power MOSFET 14, can be achieved by a construction in which the first anomaly threshold current ILoc as well as the second anomaly threshold current ILfc are set to vary directly with the source voltage Vs of the power MOSFET 14. That is, a voltage proportional to the source voltage Vs of the power MOSFET 14 may be provided as a threshold voltage to the input terminal of the comparator circuit 58, which then can output an anomaly signal by comparing the terminal voltage Vo of the external resistor 16 with the threshold voltage. (Hereinafter, this construction is referred to as "Construction A".) In Construction A, if the power supply voltage Vcc decreases, for example, by half as shown in FIGS. 12A and 12B while the power MOSFET 14 is maintained ON, the source voltage Vs of the power MOSFET 14 also decreases by half and thereby the threshold current decreases by half (as shown by points P in the graphs of FIGS. 12A and 12B). In this case, a current anomaly may be determined resulting in first forcing shutoff being immediately performed for the power MOSFET 14, even when power loss in the power MOSFET 14 is much lower than the allowable level for the power MOSFET 14. Thus, the power supply operation of the power MOSFET 14 may fail to be adequately achieved in some circumstances.

In contrast, according to the present embodiment, the first anomaly threshold current ILoc is changed not based on the source voltage Vs of the power MOSFET 14, but based on the drain-to-source voltage Vds thereof. According to this construction, in case that the power supply voltage Vcc has decreased, the drain-to-source voltage Vds varies little (as shown in the graph of FIG. 11B) as long as the power MOSFET 14 is maintained ON. Therefore, even if the power supply voltage Vcc has decreased, the first anomaly threshold current ILoc is maintained to almost the same level as before the decrease of the power supply voltage Vcc (as shown by points P in the graphs of FIGS. 11A and B). Thereby, the power supply operation of the power MOSFET 14 can be adequately achieved. When the load current IL exceeds the second anomaly threshold current ILfc, a shutoff operation (i.e., a second forcing shutoff described above) is performed for the power MOSFET 14 if the condition continues for a predetermined time. Therefore, the above problem, arising in connection with first forcing shutoff to be immediately performed, need not be considered. For this reason, the second anomaly threshold current ILfc is set to vary depending on the source voltage Vs of the power MOSFET 14, in the present construction.

Figure 13:
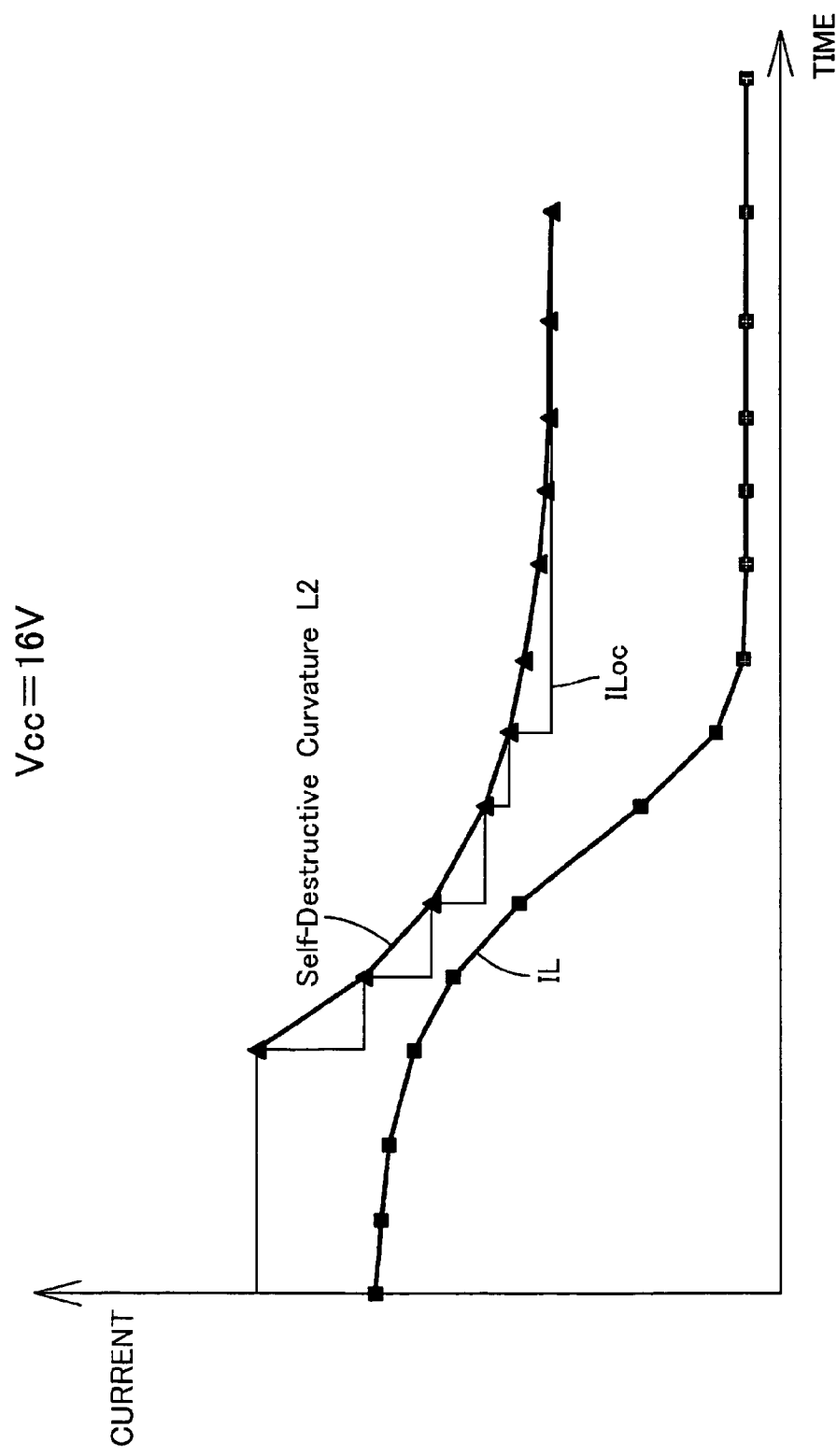
[FIG. 13] is a graph showing variation of the load current and the first anomaly threshold current when the load is a lamp (a first example)
Figure 14:
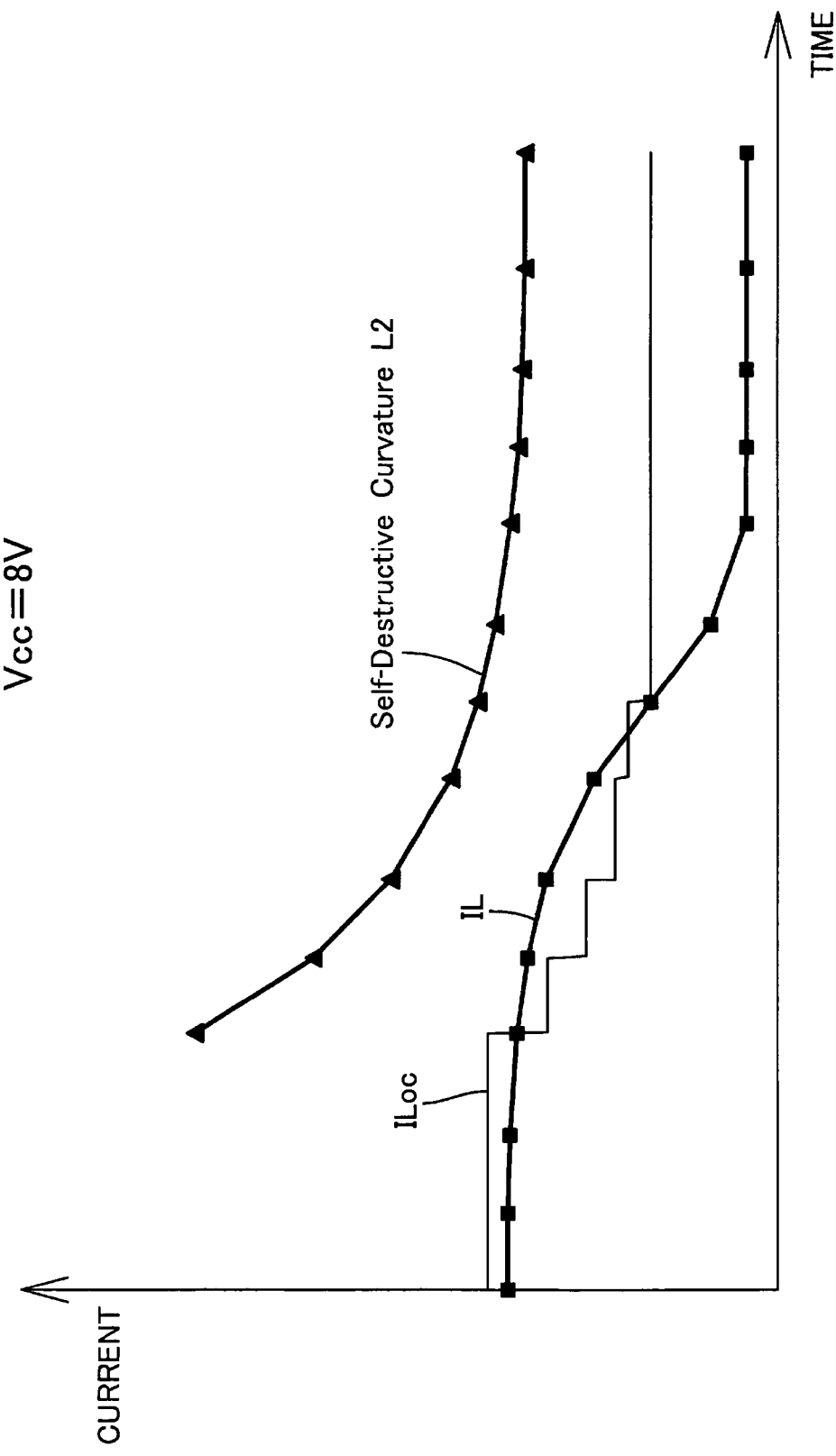
[FIG. 14] is a graph showing variation of the load current and the first anomaly threshold current when the load is a lamp (a second example)

FIGS. 13 and 14 are graphs showing variation of the load current IL and the first anomaly threshold current ILoc when the load 11 is a lamp in Construction A described above. FIG. 14 shows a case when the power supply voltage Vcc has decreased by half compared to a case shown in FIG. 13. In the case that the load 11 is a linear resistive load (through which a load current proportional to the load voltage consistently passes), the load current IL passing through the load 11 will decrease by half, if the power supply voltage Vcc and therefore the source voltage Vs of the power MOSFET 14 has decreased by half. Therefore, a current anomaly can be normally detected when short-circuiting in the load or the like has occurred immediately after turn-on of the power MOS- FET 14. However, in the case that the load 11 is a lamp, the load current IL varies according to the time constant that depends on warming of a filament, after turn-on of the power MOSFET 14. Specifically, the resistance value of the lamp is low immediately after turn-on of the power MOSFET 14, so that an inrush current can pass therethrough. Then, the filament is warmed with time, and thereby the resistance value becomes higher resulting in settlement of the load current IL at a steady-state value. The decrease of the load current IL at the time is more gradual, when the power supply voltage Vcc (and therefore the source voltage Vs of the power MOSFET 14) are lower.

Assume that the design is intended to prevent false detection, which is due to an inrush current at the time of turn-on of the power MOSFET 14, on the condition that the power supply voltage Vcc is sufficiently high as shown in FIG. 13, for example. When the power supply voltage Vcc has decreased by half as shown in FIG. 14, the first anomaly threshold current ILoc decreases by half while the load current IL is slower to drop down compared to a case shown in FIG. 13. Therefore, even when an anomaly such as short-circuiting in the load has not occurred, the load current IL may reach the first anomaly threshold current ILoc having decreased by half, resulting in a low-level output signal OC outputted from the current detector 24 due to false detection. In order to prevent this problem, the first anomaly threshold current IL can be elevated throughout. However, the first anomaly threshold current ILoc is currently set to a level as close to the self-destructive characteristics curvature L2 as possible so as to change along the self-destructive characteristics curvature L2 over time, as described above. Therefore, the threshold current should be prevented from being elevated.

In contrast, according to the present embodiment, the first anomaly threshold current ILoc is maintained at almost the same level as before the decrease of the power supply voltage Vcc. Therefore, even in the case that the load 11 is a nonlinear load such as a lamp, when the power supply voltage Vcc has decreased by half the above false detection can be prevented.

Further, in the present embodiment, the amounts of the first current Ids, the second current Ib and the third current Ic depend on the first resistor 113, the second resistor 117 and the threshold setting resistor 60. The resistors 113, 117, 60 are disposed in the semiconductor device 17, so as to have the same temperature characteristics. In addition, the resistance values thereof can vary in the same direction (i.e., in the increasing direction or decreasing direction of the resistance values) due to reasons of manufacturing of the semiconductor device 17, and therefore the resistance ratio therebetween is not prone to variation. Accordingly, the first anomaly threshold current ILoc can be set precisely as designed, while suppressing the effect of the manufacturing variation. Moreover, the second anomaly threshold current ILfc depends on the voltage-dividing resistors 60a, 60i, 60j. Therefore, the second anomaly threshold current ILfc can be also set precisely as designed.

(Measure Against Variation in Allowable Power Loss for Power MOSFET 14 Due to Ambient Temperature Variation)

Figure 15:
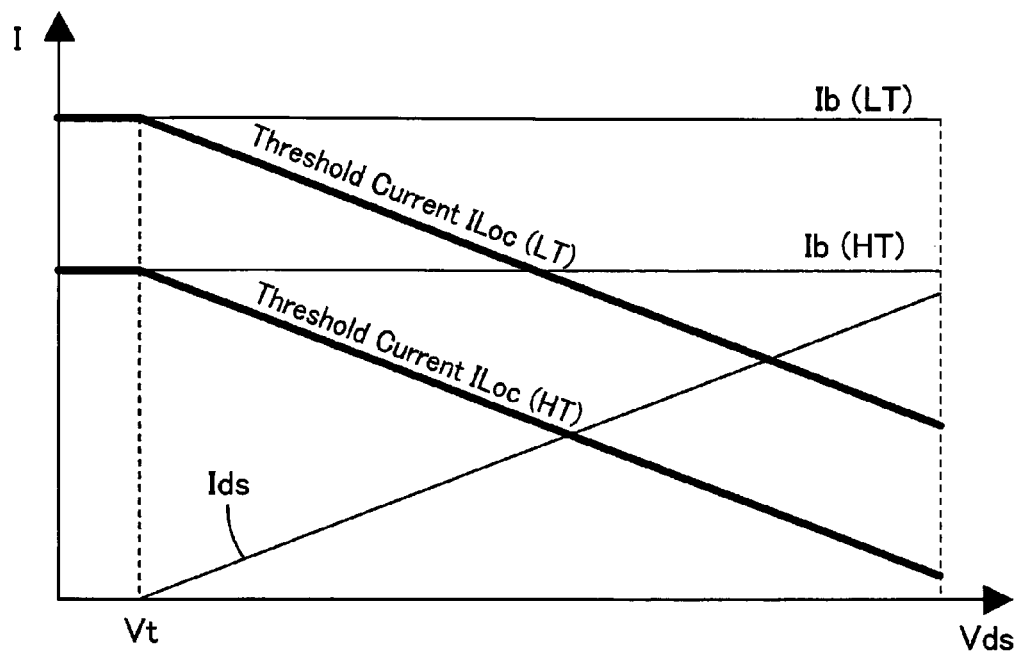
[FIG. 15] is an explanatory diagram showing a relationship among the first anomaly threshold current, first and second currents, and a temperature.

The allowable power loss for the power MOSFET 14 is lower (i.e., the self-destructive characteristics curvature L2 is lowered), when the ambient temperature is higher. The allowable power loss is higher (i.e., the self-destructive characteristics curvature L2 is elevated), when the ambient temperature is lower. In view of this, the diode 114 which has temperature characteristics (i.e., through which a lower current passes under higher temperature) is used for generating the above constant voltage Vb in the present embodiment, as described above. According to this construction, the constant voltage Vb and therefore the second current Ib are lower under higher temperature HT, as shown in FIG. 15. Thereby, the varying threshold line showing the first anomaly threshold ILoc that varies with the drain-to-source voltage Vds of the power MOSFET 14 (or the first current Ids) is lowered under high temperature condition HT, while that is elevated under low temperature condition LT. That is, a high load current IL that can pass through the power MOSFET 14 is resistant to be detected as a current anomaly under low temperature, and accordingly higher power loss can be allowed, compared to under high temperature. Thereby, the power supply operation of the power MOSFET 14 can be maximally achieved according to the allowable power loss that varies with temperature.

<Another Embodiment>

Figure 16:
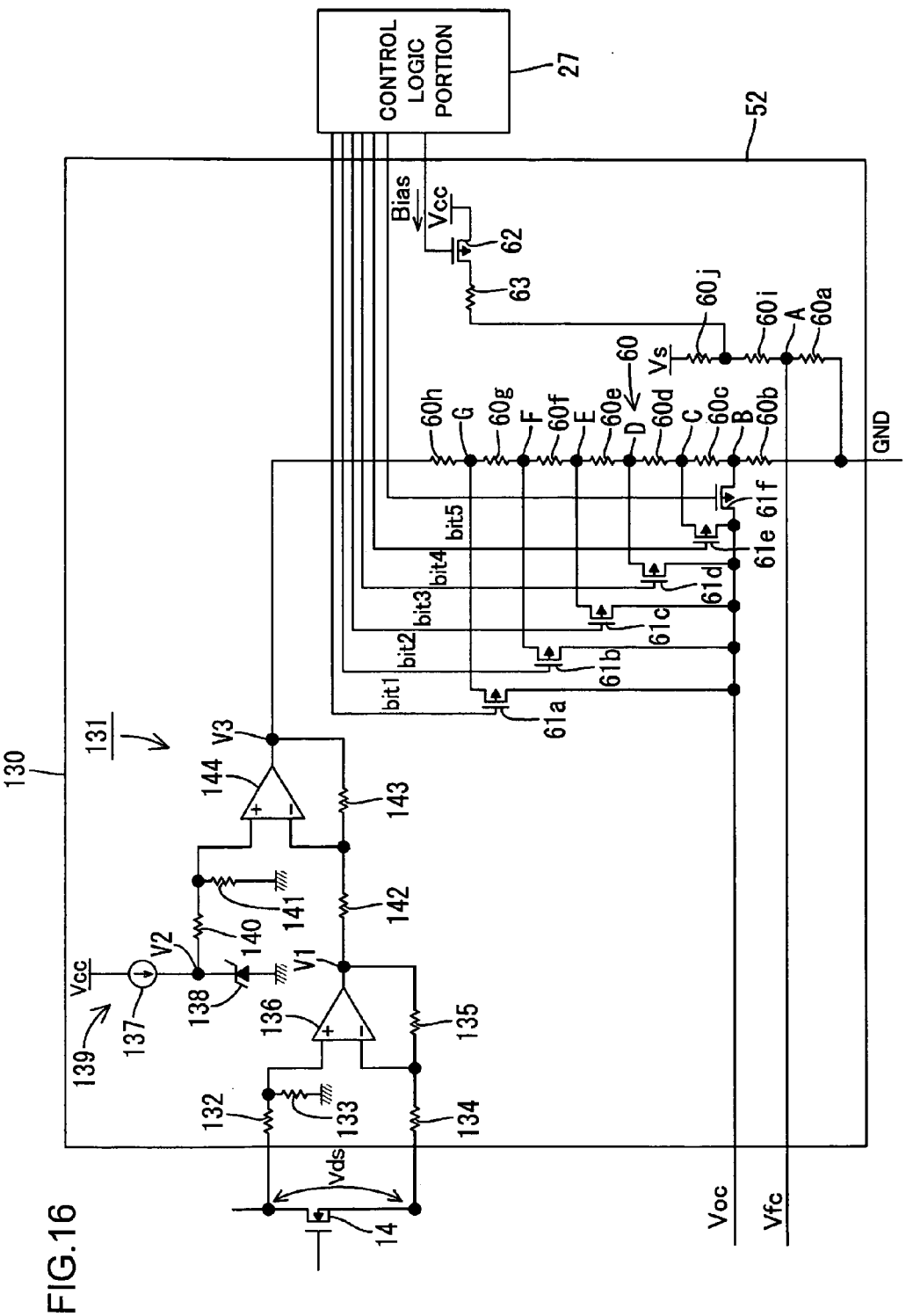
[FIG. 16] is a circuit diagram showing elements of a threshold voltage generator according to another embodiment.

FIG. 16 shows another embodiment. The difference from the above embodiment is in the construction of a threshold adjustment circuit. The other constructions are similar to the above embodiment, and therefore designated by the same symbols as the above embodiment. Redundant explanations are omitted, and the following explanation will be concentrated on the difference.

As shown in FIG. 16, a threshold voltage generator 130 as a threshold adjustment circuit includes a voltage output circuit 131 for outputting a voltage corresponding to the difference determined by subtracting a voltage corresponding to the drain-to-source voltage Vds of the power MOSFET 14 from a voltage corresponding to a predetermined constant voltage, and further includes a threshold setting resistor 60 for dividing the output voltage of the voltage output circuit 131.

The voltage output circuit 131 includes an operational amplifier 136. The positive input thereof is connected to the drain of the power MOSFET 14 via a resistor 132, and to the ground via a resistor 133. The negative input thereof is connected to the source of the power MOSFET 14 via a resistor 134, and to its own output terminal via a resistor 135. The resistance values (R1) of the resistors 132, 134 are set to be equal to each other, and the resistance values (R2) of the resistors 133, 135 are set to be equal to each other. Thereby, the output voltage of the operational amplifier 136 can indicate a first voltage V1 (=(R2/R1)·Vds) corresponding to the drain-to-source voltage Vds of the power MOSFET 14. Thus, the resistors 132-135 and the operational amplifier 136 function as "a first voltage output circuit".

The voltage output circuit 131 includes a constant voltage circuit 139, which is disposed between the power supply terminal P2 and the ground terminal P6 and includes a constant current circuit 137 and a Zener Diode 138, so as to output a second voltage V2 (as a constant voltage). Thus, the constant voltage circuit 139 functions as "a second voltage output circuit".

The voltage output circuit 131 further includes an operational amplifier 144. The positive input terminal thereof is connected to the connecting point between the constant current circuit 137 and the Zener Diode 138 via a resistor 140, and to the ground via a resistor 141. The negative input terminal thereof is connected the output terminal of the operational amplifier 136 via a resistor 142, and to its own output terminal via a resistor 143. The resistance values (R3) of the resistors 140, 142 are set to be equal to each other, while the resistance values (R4) of the resistors 141, 143 are set to be equal to each other. Thereby, the output voltage of the operational amplifier 144 indicates a third voltage V3(=(R4/R3)· (V2−V1)) corresponding to the difference determined by subtracting the first voltage V1 from the second voltage V2. Thus, the resistors 140-143 and the operational amplifier 144 function as "a third voltage output circuit". The third voltage V3 is divided by the threshold setting resistors 60b-60h, and the divided voltage is provided as the first anomaly threshold voltage Voc. The construction of the threshold setting resistor 60 is similar to that of the above embodiment.

According to this construction, when the drain-to-source voltage Vds of the power MOSFET 14 is higher, the first voltage V1 is higher while the third voltage V3 is lower. Therefore, as in the above embodiment, the first anomaly threshold current ILoc changes linearly according to the drain-to-source voltage Vds of the power MOSFET 14, so as to be lower for the domain of the voltage Vds being higher and higher for the domain of the voltage Vds being lower. Consequently, the effect similar to that of the above embodiment can be obtained.

In the present embodiment, the power supply voltage Vcc can be 16v at a maximum, while the second voltage V2 is set to 8v. The resistance ratio R1:R2 between the resistor 132 or 134 and the resistor 133 or 135 can be set to 2:1. The resistance ratio R3:R4 between the resistor 140 or 142 and the resistor 141 or 143 can be set to 1:1. However, if the resistance ratio (R2/R1) is changed to be smaller than ½, for example, the third voltage V3 and therefore the first and second anomaly threshold currents ILoc, Ilfc can be maintained at (or biased so as to be) positive values even when the drain-to-source voltage Vds of the power MOSFET 14 is a level corresponding to the maximum level 16v of the power supply voltage Vcc. That is, various values can be set so that V2−V1=V2−((R2/R1)−Vds)>0 is satisfied where Vds is its maximum value during an ON state of the power MOSFET 14, e.g., a value equal to the power supply voltage Vcc.

<Other Embodiments>

The present invention is not limited to the embodiments explained in the above description made with reference to the drawings. The following embodiments may be included in the technical scope of the present invention, for example.

(1) In the above embodiments, the power MOSFET 14 is included as a semiconductor switching element. However, the present invention is not limited to this construction. A unipolar transistor other than the above or alternatively a bipolar transistor may be included instead.

(2) In the above embodiments, the sense MOSFET 18 is used as a current detecting element. That is, current detection is performed by a sensing method. However, the present invention is not limited to this construction. The current detection may be performed by a shunt method. For example, a shunt resistor is provided on the current supply line, so that the load current can be detected based on the voltage drop thereon.

(3) In the above embodiment shown in FIG. 3 and the like, the diode 114 is used as a constant voltage element having temperature characteristics. However, an FET in which diode connection is formed may be used instead. Alternatively, a constant voltage element not having temperature characteristics, such as a Zener Diode, can be used.

(4) In the above embodiment shown in FIG. 16, instead of the Zener Diode 138, a constant voltage element having temperature characteristics (e.g., a diode, or an FET in which diode connection is formed) may be used in the constant voltage circuit 139, so that the threshold current is changed with ambient temperature around the power MOSFET 14.

(5) In the above embodiments, various current anomalies are detected by voltage comparison. However, the present invention is not limited to this construction. The current anomalies may be detected by current comparison. For example, an FET is provided so that the output end of the sense current Is (i.e., the output side of the current mirror circuit 55) is connected to the input side (e.g., drain in the case of an N-channel type) of the FET. The threshold voltage Voc (or Vfc) is applied to the gate of the FET so that a current (threshold current) corresponding to the threshold voltage Voc (or Vfc) can pass therethrough. According to this construction, a current as an anomaly signal is outputted from the connecting point between the input side of the FET and the output end of the sense current Is, when the sense current Is exceeds the threshold current.

The invention claimed is:

1. A power supply control system for controlling power supply to a load, said power supply control system comprising:
a semiconductor switching element disposed on a current supply line connected between a power source and a load;
a power supply controller configured to output an anomaly signal if a load current passing through said semiconductor switching element exceeds a threshold;
wherein said threshold decreases with increase of an input-to-output voltage of said semiconductor switching element, and increases with decrease of said input-to-output voltage.

2. A power supply controller comprising:
a semiconductor switching element disposed on a current supply line from a power source to a load;
a current detecting element configured to detect a load current passing through said semiconductor switching element;
an abnormal current detecting circuit configured to output an anomaly signal if determined based on a detection signal from said current detecting element that a load current passing through said semiconductor switching element exceeds a threshold;
a constant voltage circuit; and
a threshold adjustment circuit configured to change said threshold based on a constant voltage from said constant voltage circuit and an input-to-output voltage of said semiconductor switching element.

3. A power supply controller as in claim 2, wherein:
said threshold adjustment circuit includes a first current output circuit for outputting a first current corresponding to said input-to-output voltage, a second current output circuit for outputting a second current corresponding to the constant voltage from said constant voltage circuit, a third current output circuit for outputting a third current corresponding to a difference determined by subtracting said first current from said second current, and a threshold setting resistor through which said third current passes; and
said abnormal current detecting circuit outputs said anomaly signal if it is determined based on said detection signal and a terminal voltage of said threshold setting resistor that said load current exceeds a threshold corresponding to said terminal voltage.

4. A power supply controller as in claim 3, wherein:
said first current output circuit includes a first resistor to which said input-to-output voltage is applied, and outputs a current passing through said first resistor as said first current; and
said second current output circuit includes a second resistor to which said constant voltage is applied, and outputs a current passing through said second resistor as said second current.

5. A power supply controller as in claim 2, wherein:
said threshold adjustment circuit includes a first voltage output circuit for outputting a first voltage corresponding to said input-to-output voltage, a second voltage output circuit for outputting a second voltage corresponding to the constant voltage from said constant voltage circuit, and a third voltage output circuit for outputting a third voltage based on a voltage corresponding to a difference determined by subtracting said first voltage from said second voltage; and said abnormal current detecting circuit outputs said anomaly signal if it is determined based on said detection signal and said third voltage that said load current exceeds a threshold corresponding to said third voltage.

6. A power supply controller as in claim 2, wherein said constant voltage circuit includes a constant voltage element having temperature characteristics, and generates a constant voltage corresponding to a terminal voltage of said constant voltage element.

* * * * *